(12) United States Patent
Liu

(10) Patent No.: US 6,603,221 B1
(45) Date of Patent: Aug. 5, 2003

(54) SOLID STATE ELECTRICAL SWITCH

(76) Inventor: Zhongdu Liu, 3376 Shadow Leaf Dr., San Jose, CA (US) 95101

(*) Notice: Subject to any disclaimer, the term of this patent is extended or adjusted under 35 U.S.C. 154(b) by 0 days.

(21) Appl. No.: 09/348,980

(22) Filed: Jul. 7, 1999

Related U.S. Application Data

(60) Provisional application No. 60/130,919, filed on Apr. 22, 1999.

(51) Int. Cl.[7] ............................................. H01H 47/00
(52) U.S. Cl. ........................ 307/125; 307/130; 307/131
(58) Field of Search ................................. 307/125, 130, 307/131; 327/452, 455, 469, 476

(56) References Cited

U.S. PATENT DOCUMENTS

| | | | |
|---|---|---|---|
| 3,660,688 A | 5/1972 | Evans et al. | 307/252 W |
| 3,676,685 A * | 7/1972 | Myer | 307/117 |
| 3,679,910 A | 7/1972 | Williams | 307/252 W |
| 3,723,815 A * | 3/1973 | Ambler et al. | 361/45 |
| 3,886,376 A * | 5/1975 | Asija | 307/116 |
| 3,899,713 A * | 8/1975 | Barkan et al. | 315/34 |
| 3,922,563 A * | 11/1975 | Penman | 307/116 |
| 4,119,864 A | 10/1978 | Petrizio | 307/116 |
| 4,246,494 A | 1/1981 | Foreman et al. | 307/116 |
| 4,250,432 A | 2/1981 | Kohler | 315/291 |
| 4,264,831 A | 4/1981 | Wern | 307/252 H |
| 4,289,972 A | 9/1981 | Wern | 307/116 |
| 4,289,980 A | 9/1981 | McLaughlin | 307/308 |
| 4,336,464 A * | 6/1982 | Weber | 307/141.4 |
| 4,360,737 A | 11/1982 | Leopold | 307/116 |
| 4,504,778 A * | 3/1985 | Evans | 323/323 |
| 4,651,022 A | 3/1987 | Cowley | 307/116 |
| 4,672,229 A | 6/1987 | Skarman et al. | 307/115 |
| 4,703,194 A | 10/1987 | Brovelli | 307/116 |
| 4,731,548 A | 3/1988 | Ingraham | 307/116 |
| 5,030,890 A | 7/1991 | Johnson | 315/208 |
| 5,550,463 A | 8/1996 | Coveley | 323/300 |
| 6,060,793 A * | 5/2000 | Cousy | 307/125 |
| 6,141,197 A * | 10/2000 | Kim et al. | 361/93.5 |

FOREIGN PATENT DOCUMENTS

| | | | | |
|---|---|---|---|---|
| EP | 1 052 776 A2 | * | 11/2000 | H03K/17/725 |
| JP | 2000-357955 | * | 12/2000 | H03K/17/00 |

* cited by examiner

*Primary Examiner*—Fritz Fleming

(57) ABSTRACT

A 2-terminal solid state electrical switch is provided which can be connected in series with a load device in a the same manner as a conventional mechanical-contact switch, does not leak current during an "OFF" state, and operates from a dynamic pulse run mode during an "ON" state. The two-terminal solid state electrical switch of the present invention requires neither a power supply to operate, nor any mechanical movement and contact points. Consequently, no spark, arc or any mechanical noise is created in the solid state electrical switch's operation, nor does it corrode, thus allowing it to be used in a hostile environment. The solid state switch of the present invention can be put to uses not practical for conventional mechanical-contact switches, such as to control multi-appliances, as static circuit breakers, contactors and relays for fire-proof, explosion-proof, water-proof, anti-chemical, anti-corrosion, humidity resistant, dust resistant, anti-vibrations and heavy duty frequently operations. Further, a unique initialization circuit in the solid switch of the present invention resets the switch intelligently to a suitable operating mode after a power interruption, thus avoiding accidents that may endanger property and lives. The present invention also provides a highly isolated multi-point random remote control switch/relay suitable for wide industrial and other applications.

86 Claims, 18 Drawing Sheets

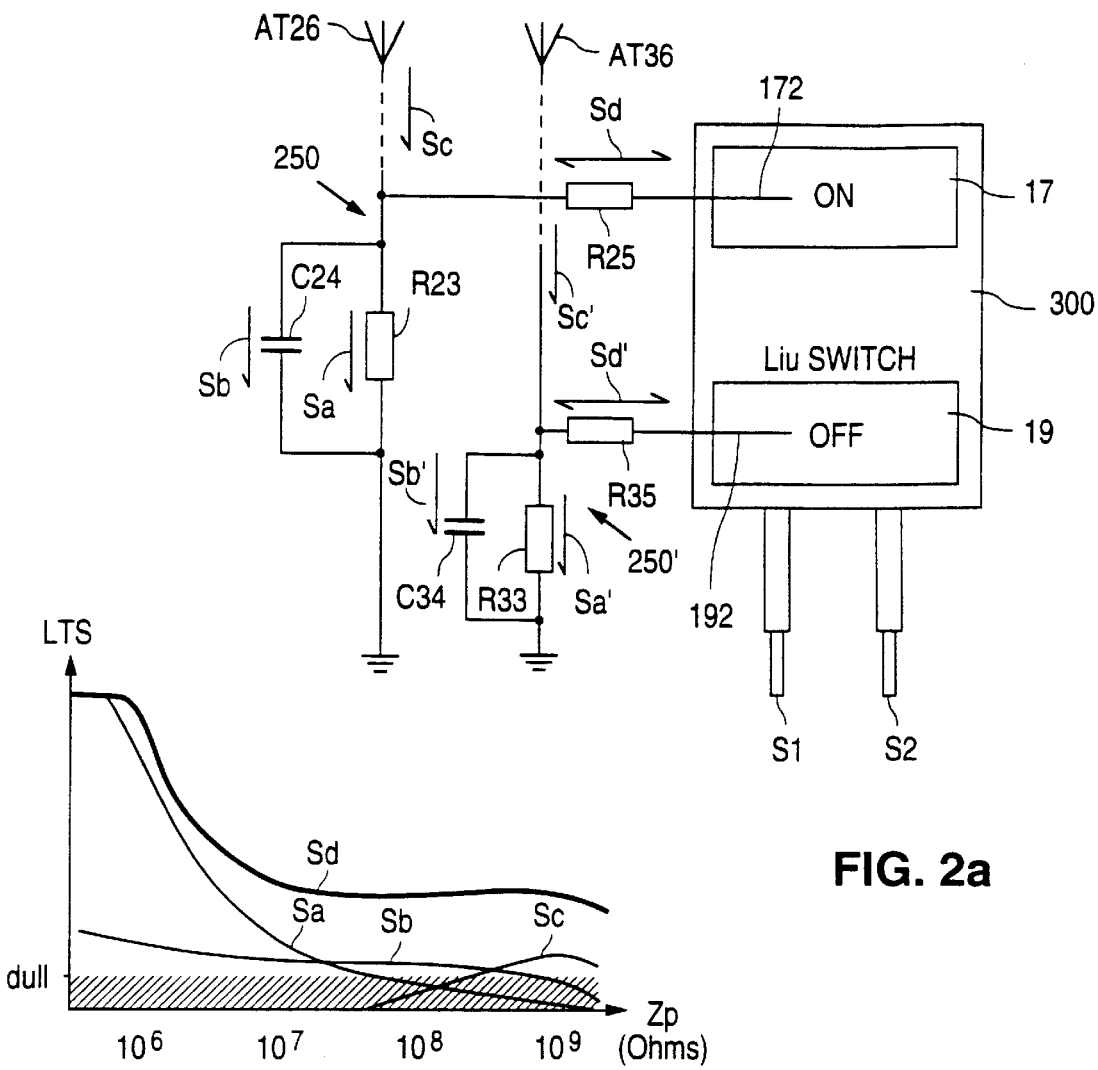
FIG. 2a
FIG. 2b
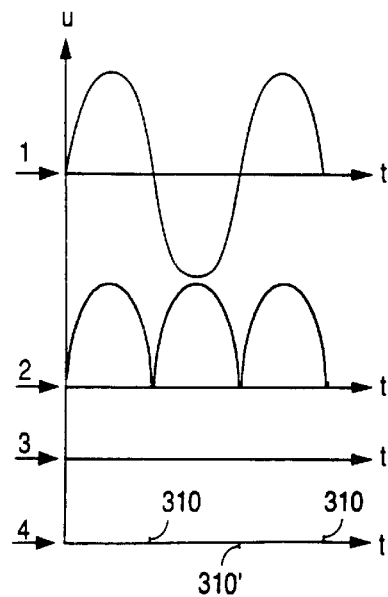
FIG. 3

SOLID STATE ELECTRICAL SWITCH

CROSS-REFERENCE TO RELATED PATENT APPLICATIONS

This patent application is related to and claims priority of U.S. Provisional Patent Application Serial No. 60/130,919, filed on Apr. 22, 1999 entitled "Solid State Electrical Switch", also owned by the inventor of this patent application.

BACKGROUND OF THE INVENTION

1. Field of the Invention

The present invention relates to an electrical switch. In particular, the present invention relates to a single-pole solid state electrical switch which can be directly connected to the AC power lines.

2. Discussion of the Related Art

The basic electrical circuit includes a power switch, and a load connected in series with the power switch, connected across the output terminals of a power source (e.g., an AC outlet). Typically, the power switch is a mechanical device which makes or breaks an electrical contact. The electrical contact is made or broken by a mechanical force provided either manually or through a magnetic field (e.g., a relay). A manually operated conventional mechanical switch typically toggles between "ON" (conducting) and "OFF" (non-conducting) states by a mechanism of levers and springs. Such a power switch has typically a low reliability and a short life-time, especially when operating in a hostile environment (e.g., inflammable explosive, high temperature, high humidity, dusty or corrosive atmosphere, and severe vibrations). Such a power switch is susceptible to failures resulting from electrical arcing, sparks, mechanical wearout, corrosion, wetting, contact welding or contact miss. Under some circumstances, a failure of a power switch can lead to fires and other industrial accidents, endangering property and lives. To improve performance of these conventional mechanical switches, expensive modifications and use of precious metals are often required. Such improved switches remain susceptible to wearing out and frequent maintenance. Load damage can result from a defective mechanical switch.

Typically, in a conventional power switch, if the power switch is in the "ON" state when the interruption occurs, the power switch does not reset itself to the "OFF" state after a power interruption. Under such circumstances, accidents can often occur when the supply of power is resumed unexpectedly. For safety reasons, in many heavy machinery, magnetic contactors are provided to reset the power switch. Such magnetic contactors typically are cumbersome, expensive and complicated, dissipate power and create "low frequency hum" noise. In areas where the power supply is noisy, i.e., where there are frequent transient "snap-offs" and "power slots", the corresponding frequent resets required for conventional mechanical switches create significant inconvenience.

In a conventional mechanical circuit breaker, the electro-magnetic tripping or/and thermal tripping mechanism for overcurrent protection is not designed for frequent operations. When used with conventional mechanical switches in an electrical circuit with many branches, such a circuit breaker does not individually provide overcurrent protection to branch circuits and terminal loads. Typically, in most home or office applications, a master circuit breaker provides overcurrent protection to a large number of switches, so that overcurrent in one circuit results in shutting off a large number of circuits protected by the same overcurrent protection.

For over-voltage protection, a solid state device of the prior art (e.g., a solid state switch) is typically protected by a protective device which can be either a varister or a special thyristor connected in parallel with the solid state switch. In the "off" state of the solid state switch, when a substantial over-voltage occurs (e.g., when the voltage across the solid state switch exceeds the "breakover" voltage of the thyristor), the protective device becomes conducting to limit the voltage drop across the solid state device, thus protecting the solid state switch from damage by the over-voltage. However, if the over-voltage persists, the high current in the protective device can generate sufficient heat to irreversibly destroy the protective device over time. Thus, such an over-voltage protection scheme is expensive both because of the cost of the protective device and also for the cost of replacing the protective device.

In addition, conventional switches are not practical for implementing multi-point "random" control (i.e., to allow switching "ON" or "OFF" of a piece of machinery at any one of multiple locations) beyond three control points, because of the complex switch logic and the large number of wires that are required.

Because of the cost and the above disadvantages of the conventional switch, a solid state electrical switch is long desired. However, until now, one fundamental technical problem has not been solved—a solid state electrical switch is necessarily an electronic circuit. As an electronic circuit, a DC power supply is typically required. In most integrated circuits, such a DC power supply operates at one or more lower DC supply voltages, such as 2.7 v, 3.3 v, 5 v, or ±5 v, ±12 v, . . . , ±35 v, . . . between power pins $V_{CC}$ (or $V_{DD}$) and ground (or $V_{SS}$). Thus, unless a battery provides the supply voltages, a power supply circuit is necessary to provide the operating voltages. As a power switch, which is typically connected in series with a load, such a power supply circuit necessarily draws a current through the load, in the form of a leakage current. Such a leakage current, even though from several milliamperes to tens of milliamperes, in fact, operates the load under an "undervolt-age condition." While such a switch may still be acceptable, for example, as a electronic dimmer in a lighting application, such a switch would be unacceptable, especially from a safety point of view, in applications such as fluorescent lights, AC motors, transformers or other appliances. For example, under the safety standards in virtually all countries and recognized safety organizations (e.g., the Underwriter Laboratories), a power switch which allows a leakage current in the milliampere range or higher is considered unsafe. In fact, for this reason, dimmers and electronic timers, even though connected serially with the lighting, are considered electronic appliances or loads rather than power switches. In many applications, where safety is a paramount concern, an additional conventional mechanical switch is often required to be provided in series with the electronic dimmer or timer.

In the prior art, without exception, the electronic circuit of a 2-terminal solid state switch is connected in parallel to the load current-conducting component (e.g., between the two anodes of a triode AC switch, or TRIAC). Examples of these switches can be found, for example, in U.S. Pat. Nos. 5,550,463 and 5,030,890. Thus, these switches draw a significant current during the solid state switch's "off" state. From a switch current requirement point of view, any one of such 2-terminal solid state switches is not different from a solid state switch which draws a current through a third terminal directly coupled to the power source.

In addition, in the "ON" state of a solid state switch of the prior art, the voltage drop across the solid state switch (e.g., across a TRIAC), $V_{on\text{-}sat}$, is typically 0.8 to 1.8 volts AC. Thus, the electronic circuit of the solid state switch, which is connected in parallel with the switch terminals (i.e., across $V_{on\text{-}sat}$), does not receive sufficient rail-to-rail voltage for proper operation. Alternatively, for example in U.S. Pat. No. 3,660,688 and 4,289,980, to obtain the operating voltages from the two terminals of the solid state switch, the voltage drops $V_{on\text{-}sat}$'s across the solid state switch can be maintained at the higher voltage ranges of 2.4–4.0 volts and 12–14 volts, respectively. However, in those solid state switches, the power dissipation can be significant. For example, if one of the solid state switches of U.S. Pat. Nos. 3,660,688 and 4,289,980 is used in series with a 120 volts, 5-amp light fixture, the power dissipation in the solid state switch would reach 12–20 watts, in one case, and 60–70 watts, in the other case! To handle such severe power dissipation, not only are bulky heat sinks required, the resulting low performance and insufficient operating voltages across the load render such solid state switches impractical and undesirable.

In FIG. 1 of U.S. Pat. No. 4,703194 to Brovelli ("Brovelli"), a 2-terminal network is disclosed. However, as in the prior art solid state switches discussed above, the main switch formed by the rectifier bridge (i.e., diodes 1-4) and the silicon controlled rectifier (SCR) 6 provide an "ON" state voltage drop $V_{on\text{-}sat}$ of 2.4–4.0 volts. Thus, as in the solid state switches discussed above, a load current of 6 amperes would result in a power dissipation of 13–24 watts across the solid state switch. Further, to avoid SCR 6 from switching off when the AC voltage crosses zero volts, the "ON" state of Brovelli's solid state switch is maintained by the charge stored in capacitor 7. Capacitor 7 maintains a voltage (e.g., 0.7 volts) exceeding the trigger voltage of SCR 6. However, polarized capacitor 5, which Brovelli requires a 1-μf electrolytic capacitor and performs a low-pass filtering function for the load current, cannot be used to sustain a load current exceeding one ampere. Under normal "OFF"-state operation, an electrolytic capacitor working on high voltage and high ripple current conditions, or a harsh surge power line, the leakage current flowing into the load can cause a breakdown, leading to undesirable and unpredictable results.

Further, to ensure that the solid state switch has high sensitivity, SCR 6 must be of high sensitivity also. Typically, because of the high sensitivity required, the gain of SCR 6 is relatively low, and thus can carry only a relatively small current (e.g., TIC106D SCR is rated for a current of about 1 ampere). In order to provide a higher current, a high power component, such as a TRIAC, must be included in the solid state switch. However, such a TRIAC would short the anode and cathode terminals of SCR 6, draining charge from capacitor 7 at the gate terminal of SCR 6, so that the "ON" state of SCR 6 cannot be maintained when the input voltage crosses zero. Thus, Brovelli's design cannot be used with practical currents, and cannot be extended to handle a larger current by simply including a high power component.

Furthermore, Brovelli's solid state switch is turned on and off by triggering highly sensitive SCRs 6 and 9 through small currents created in touch plates 15 or 14 through resistors 8 and 11 respectively. Currently commercially available high-sensitivity SCRs (e.g., Mitsubishi's CR02AM and CR03AM, and Motorola's MCR100-8 and TIC106D) all require at least 200 μA to trigger. However, when a human body contacts a touch plate, such as touch plate 14, the impedance between the touch plate and ground through the human body can often be as high as 100 megaohm, thereby providing a current much lower than 200 μA and insufficient to trigger SCR6 or SCR9 to effectuate turning Brovelli's solid state switch "ON" or "OFF". At other times, the resulting impedance between the ground and the touch plate through the human body can cause a current exceeding 200 μA, thereby causing electric shocks or raising other safety issues. For these reasons, Brovelli's solid state switch is deemed impractical.

SUMMARY OF THE INVENTION

The present invention provides a fully solid state 2-terminal electrical switch (referred to as the "Liu Switch"), which can be used with a single pole application (i.e., the load and the switch are coupled in series to an AC power line). The Liu Switch is a static switch which does not include any mechanical or moving component, and therefore is not susceptible to wear and tear. As the Liu Switch does not include mechanical contact points, it does not create a spark, an arc, corrosion, or mechanical noise, and can withstand operations in a hostile environment, such as a high temperature, high humidity, corrosive, dusty or intensely vibrating environment.

In one embodiment of the present invention, the Liu Switch, which can be directly connected in series with a load and an AC power outlet, includes (a) a semiconductor switch device controlled at a control terminal by a control signal which determines whether the semiconductor switch is in a conducting or non-conducting mode; (b) a rectifier receiving an AC signal from the terminals of the semiconductor switch device during the non-conducting mode of the semiconductor switch; and (c) a control circuit including a capacitor which (i) is coupled to receive the rectified signal of the rectifier during the non-conducting mode of the semiconductor switch and (ii) is discharged in response to an electrical signal from a gain circuit coupled in parallel to said capacitor.

In one implementation, during the non-conducting mode of the semiconductor switch, the rectified DC signal maintains the capacitor in a fully charged condition. The semiconductor switch remains in the non-conducting mode until the electrical signal which causes the capacitor to discharge is received. The electrical signal which causes the capacitor to discharge can be, for example, an electrical signal associated with a button being pressed. After the capacitor is discharged, the rectified DC signal provides a charging current to bring the capacitor back to a fully charged state. This charging current then provides the control signal, in the form of a trigger signal, to put the semiconductor switch into a conducting mode. The conducting semiconductor switch causes the capacitor to discharge. However, at each zero-crossing of the AC signal, the semiconductor switch device momentarily becomes non-conducting again, so as to allow the rectified DC signal to charge the capacitor. The charging current then regenerates the trigger signal to put the semiconductor switch device back into the conducting mode. Thus, once the semiconductor switch device is in a conducting mode, a regenerative or feedback process provides a control signal (e.g., the trigger signal) that ensures that the semiconductor switch device remains in the conducting mode.

In one implementation, the control circuit further includes a second gain circuit responsive to a second electrical signal. The second electrical signal causes a signal path to be provided between the control terminal and a common ground of the control circuit, thus interrupting the feedback process by shunting the control or trigger signal to ground.

The control circuit further includes an initialization circuit having a capacitor (the "second capacitor") coupled between the control terminal and the common ground. The second capacitor has a capacitance larger than the capacitance of the capacitor of the control circuit (the "first capacitor"). A forward-biased diode couples the control terminal to the second capacitor. A resistor connected in parallel with the second capacitor, in combination with the rest of the control circuit forms a circuit ("Liu's Network") with multiple time constants. In one the embodiment, Liu's Network serves as both a state memory and an initialization circuit. At initialization (e.g., when power is first applied), the second capacitor of Liu's Network provides a large capacitance which absorbs the initial charging current of the first capacitor. Thus, the trigger signal that places the semiconductor switch device into the conducting mode is prevented. As a result, the Liu Switch remains in a non-conducting mode upon initialization.

Further, upon a power interruption occurring when the Liu Switch is a conducting mode, the Liu Switch remains in the conducting mode if the power resumes after a time period less than a predetermined time interval, and becomes non-conducting when the power interruption lasts longer than the predetermined time interval. Within the predetermined time interval, Liu's Network serves as a state memory which retains the conducting or non-conducting mode of the Liu Switch prior to the power interruption. In one implementation, the second capacitor is realized by an electrolytic capacitor and an unpolarized capacitor coupled in parallel.

In one implementation of the Liu Switch, the control circuit further includes a second gain circuit having a terminal which receives an external signal. Absent the external signal (e.g., a trigger signal generated by a button being pushed), the second gain circuit does not draw any current and has a high output impedance.

According to one aspect of the present invention, the Liu Switch further includes a zero-crossing detection circuit coupled to receive the rectified signal and coupled to the control terminal. The zero-crossing detection circuit prevents the control signal from being asserted except when the instantaneous magnitude of the rectified signal is below a predetermined voltage. In one implementation, the zero-crossing detection circuit includes a transistor which shorts the control terminal to common ground when the instantaneous magnitude of the rectified signal rises above the predetermined value. In one implementation, the zero-crossing detection circuit is implemented by a transistor controlled by an output signal of a voltage divider between an output terminal of the rectifier and a common ground.

In addition, a light-emitting diode (LED) and a Zener diode connected in series with the voltage divider can be included. The LED can serve as a "night light" to allow the electrical switch to be visible for certain applications.

According to another aspect of the present invention, the Liu Switch includes a current detector coupled in series with the load and the semiconductor switch to provide a signal indicative of the current in the current detector. In one embodiment, the Liu Switch further includes an overcurrent protection circuit which forces the semiconductor switch into a non-conducting mode when the current detector indicates a current exceeding a predetermined value. The current detector can be implemented by a transformer. In one embodiment, the overcurrent protection circuit includes temperature-sensitive components, so that the threshold for overcurrent protection circuit can be self-tracking and adapted in accordance with the temperature of the environment and the temperature of the Liu Switch itself.

In one embodiment, the overcurrent protection circuit includes (a) a rectifier receiving a signal indicative of the current in the current detector to provide a voltage signal which represents the current in the current detector; and (b) a threshold component which becomes conducting when the magnitude of the current in the current detector exceeds a predetermined value. The threshold component can be implemented by a silicon diode, a Zener diode or a four-layer Shockley diode. The rectifier of the overcurrent protection circuit can be implemented by a Zener diode, or a diode bridge. Further, the overcurrent protection circuit can include a resistor network between the rectifier and the threshold component. This resistor network can include temperature-sensitive devices (e.g., thermisters or other thermal devices) which compensate and further fine-tune the overcurrent protection circuit's temperature response. By appropriately selecting the temperature characteristics of the temperature-sensitive devices, the tripping condition of the overcurrent protection circuit can be automatically adjusted according to the temperature of the operating environment and the temperature of the switch.

In accordance with the present invention, the Liu Switch further includes an optocoupler which controls a Liu Switch in response to any one of multiple external signals received at various points of a control bus, thus providing "multi-point random control" to the Liu Switch.

In one implementation, the Liu Switch is provided by a diode bridge and a silicon controlled rectifier (SCR). In a second implementation, the semiconductor switch is implemented by a TRIAC. In a third implementation, the semiconductor switch is implemented by antiparallel silicon controlled rectifiers. The rectifier circuit of the Liu Switch can be provided by a SCR controlled bridge rectifier. A low-pass filtering circuit can be coupled to a signal terminal of the semiconductor switch device to further protect the semiconductor switch, by absorbing any surge, shock or noise in the control input signal, thus keeping the system in steadily operations.

The touch panels can each include a metallic surface, or a metallic surface coated with a resistive material or an insulator. The touch panel can be mounted in a plane offset from a mounting plate (e.g., in a shallow depression or provided slightly protruding over the surface of the mounting plate). In one implementation, where two touch panels (one for the "ON" function and one for the "OFF" function) are provided, the touch panels are provided different colors or provided different tactile feels.

According to another aspect of the present invention, the Liu Switch includes a beep circuit for providing an audible response, in the form of a "beep" sound, to the external agent when the agent contacts a touch panel. The beep sound response can be provided by a Zener diode and a piezoelectric speaker connected in series across an output terminal of the rectifier of the Liu Switch and a common ground. The beep circuit can generate audible and distinguishable beep sounds to indicate which of the two touch panels is contacted.

In the control circuit of the Liu Switch, the various components (e.g., the gain circuits, the SCR controlled rectifier, the semiconductor switches, or the audio response circuit) are each selected such that, during the "off" state of the semiconductor switch, the leakage current in each component is negligible. Consequently, negligible power is drawn by the Liu Switch during its "off" state.

Another advantage of the present invention is a state-latched control contact panels which retain the "ON" or "OFF" state after contact by the external agent is broken. Based on this latch function, the Liu Switch of the present invention provides a multipoint random remote control system, including: (a) a 2-terminal Liu Switch coupled in series with a load circuit between two lines of an AC power outlet; (b) an optocoupler coupled to the Liu Switch, the optocoupler providing a very high electrical isolation between the AC power lines and an external remote control signal bus from which the optocoupler receives input signals; and (c) controllers (e.g., computers) coupled to the signal bus, each capable of asserting on the signal bus the control signals. The Liu Switch provides an "ON/OFF" latching feature which allows random control by an unlimited number of external controllers and computers. In one implementation, the signal bus include an independent external common ground to which both the "ON" signal and the "OFF" signal reference. In another implementation, separate independent external common ground references are provided for separate transmission and isolation between "ON"-channel and "OFF"-channel on a four-wire external signal bus.

One aspect of the present invention provides a Liu Switch with no current leakage to the load in the "OFF"-state. Another aspect of the present invention provides a Liu Switch operating under a fully dynamic run mode during the "ON"-state. The switch of the present invention operates from power received during the zero-crossing of each half-cycle of the input AC signal, thereby obviating a DC power supply. Thus, unlike any electronic switch in the prior art, the Liu Switch connects in series directly to the AC standard power line.

Another advantage of the present invention provides a static overcurrent tripping circuit and an automatic reset circuit in a Liu Switch. Thus, inexpensive independent overcurrent protection is provided at every load point. Independent overcurrent protection at every load point provides unsurpassed protection for property and lives.

Another advantage of the present invention is a universal Liu Switch capable of being directly connected to standard 120 volts, 220 volts or higher voltage AC power outlet.

According to another aspect of the present invention, an initialization and power recovery reset circuit ("Liu's Network") is provided, including: a capacitor connected in series with a diode between a control terminal and ground, and a resistor connecting in parallel with the capacitor.

Another advantage of the present invention provides "optional functions" in a Liu Switch. Such optional functions include providing a night light or a visible indicator on the Liu Switch. The night light or indicator function can be achieved using passive fluorescent materials, such as some chemical compounds of phosphates or sulfurs.

In one embodiment, an efficient LED is incorporated into a zero-crossing detecting circuit of the Liu Switch. In that embodiment, the forward voltage of the LED provides a threshold level to the zero-crossing circuit, and the LED provides a night light to illuminate the switch. In "OFF" state, the LED draws a current drawing less than 200 $\mu A$.

Another advantage of the present invention provides a Liu Switch with a programmable dynamic threshold value for overcurrent tripping protection. The threshold value adapts to temperature, loading and environment conditions, and the configuration of the switch itself. LTS character especially can be use to create a smart terminals in electrical network.

The touch panels of the present invention is based on a discovery of an impedance effect related to the human body, called the "Liu's touch signal complementary effect" (referred below as the "LTS" effect). The LTS effect result from the impedance properties of the human body, i.e., acting both as an impedance to ground and as an equivalent inductive signal source, over a wide range of environmental conditions. The LTS effect allows the Liu Switch to be reliably switched "ON" and "OFF" over practically all environmental conditions by a human through the touch panels.

In that embodiment, a touch panel is electrically couple to the control circuit of the Liu Switch, such that when the touch panel is contacted by an external agent (e.g., a human operating the switch), an electrical path is created, and the LTS effect triggers the control circuit of Liu Switch.

According to on the aspect of the present invention, the "ON" and "OFF" touch panels of the Liu Switch can be created to be different in position, color, shape, or texture, so as to ensure safety and precision operations. Such touch panels can be made from metal, resistive non-metals or conductors plated with an insulating material. In a Liu Switch of the present invention, different contact durations at the touch panels are required to trigger the Liu Switch's "ON" and "OFF" operations. In some embodiments, the touch panels are designed to prevent triggering by inadvertent contacts. For example, each touch panel can be provided a contact surface in a shallow depression.

In accordance with on the aspect of the present invention, the touch panels can be operated even when an operator is wearing gloves. This capability can be important in certain applications which require a piece of machinery to be disabled during emergency and within a very short time period. In such applications, the delay caused by an operator removing his or her work gloves in order to operate the switch is very undesirable. In accordance with another aspect of the present invention, when the first and second touch panels are touched substantially simultaneously, the Liu Switch resolves to an "OFF" state, thus preventing operating a load device inadvertently.

The Liu Switch of the present can control a resistive load, an inductive load, and some special loads, such as a fluorescent light, and can also be used to control mixed loads.

The present invention is better understood upon consideration of the detailed description below and the accompanying drawings.

BRIEF DESCRIPTION OF THE DRAWINGS

FIG. 2a shows equivalent circuits 250 and 250' each representing a human body in contact with a touch panel (i.e., touch panel 17 or 19).

FIG. 2b shows characteristic curves $S_a$, $S_b$, $S_c$, $S_d$, representing respectively, the resistive (leakage), distributed capacitive, and equivalent inductive signal source components, and the sum total of the Liu's touch signal complementary effect (the "LTS" effect) as a function of the impedance of the human body.

FIG. 3 shows waveforms 1–4, representing (i) the voltage across load 2, when solid state switch 300 is in the "ON" state; (ii) the voltage across terminal 83 and the common ground of trigger and control circuit 200, when solid state switch 300 is in the "OFF" state, (iii) the voltage across load 2, when solid state switch 300 is in the "OFF" state, and (iv) the voltage across terminals 01 and 02, including events 310 and 310' in the voltage waveform at zero crossings of waveform 1, when Liu Switch 300 is in the "ON" state.

FIGS. 7b–7d show embodiments of the present invention in circuits 720, 740, and 760, each of which being a modification of circuit 700 of FIG. 7a.

DETAILED DESCRIPTION OF THE PREFERRED EMBODIMENT

Figure 1:
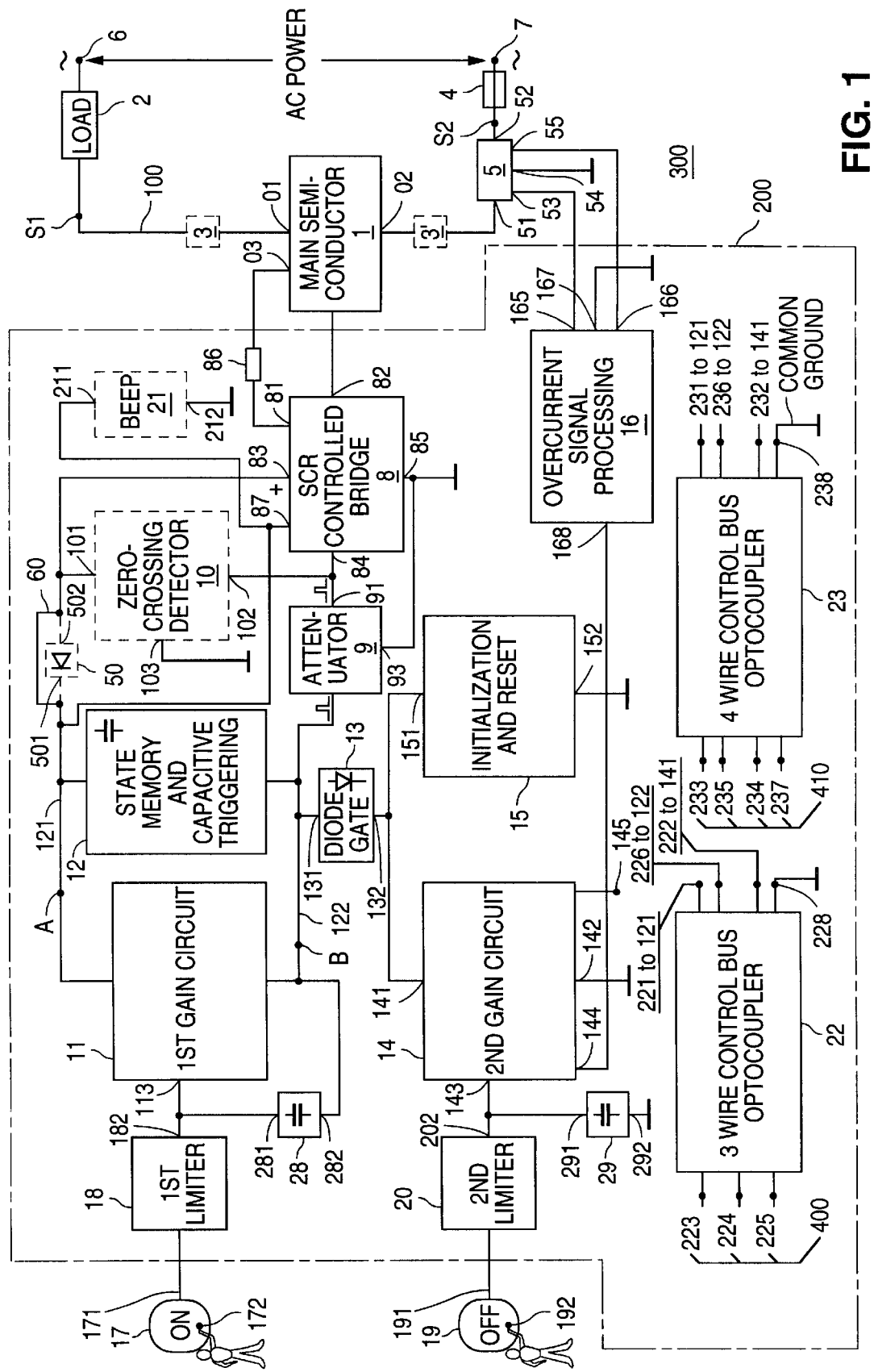
FIG. 1 is a system block diagram of an electrical circuit 100, including control circuit 200 in solid state switch ("Liu Switch") 300 in accordance with the present invention.

The present invention provides a solid state switch ("Liu Switch"), which is illustrated by way of example in electrical circuit 100 of FIG. 1. As shown in FIG. 1, electrical circuit. Circuit 100 includes, connected in series, main semiconductor switch 1, load 2, trigger and control circuit 200, electromagnetic interference (EMI) suppressers 3 and 3', fuse 4 (for short circuit current protection), current detector device 5, terminals 6 and 7 for connection to AC power outlet, and touch panels 17 and 19 for conveying external input signals to trigger and control circuit 200. In one embodiment, the Liu Switch ("Liu Switch 300") incorporates main semiconductor switch 1, current detector device 5, and trigger and control circuit 200. Together with load 2, Liu Switch 300 forms electrical circuit 100.

Trigger and control circuit 200 includes a silicon controlled rectifier (SCR) controlled bridge rectifier 8, an attenuator 9, first gain circuit 11, second gain circuit 14, current-limiters 18 and 20, initialization and power recovery circuit 15, diode gate 13, state memory and trigger circuit 12, and filter circuits 28 and 29. In one implementation of trigger and control circuit 200, for example that shown in FIG. 7a, state memory and trigger circuit 12 includes a capacitor C1 and initialization and power recovery circuit 15 includes capacitor C4.

Gain circuit 11, which is coupled to control terminal 113 and terminals 121 and 122, is designed such that, when no input signal is provided at control terminal 113, a high impedance exists between terminals 121 and 122, so that no current flows in gain circuit 11. Conversely, when an input signal is provided at terminal 113, a low impedance exists between terminals 121 and 122. Gain circuit 14, which receives a signal at control terminal 143 and controls the impedance between "executive" terminal 141 and terminal 142, can be similar constructed. In this embodiment, however, gain circuit 14 includes additional control terminals 144 and 145, each of which can also be triggered to provide a low impedance path between terminal 141 and common ground terminal 142. Control terminal 144 is provided to allow triggering gain circuit 14 during an overcurrent condition, and one or more control terminals 145 are provided to respond to other conditions for which Liu Switch 300 is to be turned "OFF".

Initialization and power recovery circuit 15 and diode gate 13 together provide a "Liu's Network" (described in further detail below) which includes a diode (D3), an electrolytic capacitor (C4) and a resistor R8. An unpolarized capacitor C4' can be connected in parallel to capacitor C4 to allow a faster response, as explained below. Initialization circuit 15 ensures that Liu Switch 300 is in the "OFF" state when power is first applied across its terminals.

SCR controlled bridge rectifier 8 includes a triggerable circuit, such as an SCR ("SCR1"), which becomes conducting when triggered by a control signal at terminal 84. When SCR1 conducts, main semiconductor switch 1 also conducts, thus resulting Liu Switch 300 to be triggered into a conducting mode. As explained below, once triggered into the conducting mode, Liu Switch 300 generates its own subsequent trigger signals at terminal 84 to maintain Liu Switch 300 in the conducting mode. Main semiconductor switch can be implemented, for example, by a TRIAC or SCRs.

Trigger and control circuit 200 also includes the following "optional" components: zero-crossing detector 10, coupling diode 50 (replacing jumper 60, when zero-crossing detector 10 is included), "beep" circuit 21, current detector device 5 (for overcurrent protection), overcurrent protection circuit 16, and optocoupler 22 with external control bus 400, or an optocoupler 23 with external control bus 410. These optional components allow the Liu Switch to be used in a multi-point random remote control scheme as an electrically highly isolated relay ("Liu Switch-Relay").

SCR controlled bridge rectifier 8 includes AC terminals 81 and 82, a DC output terminal 83, trigger terminal 84, executive terminal 87, and terminal 85, which is coupled to a common "ground" of control and trigger circuit 200. Resistor 86 can be provided in series with AC terminals 81 and 82. When main semiconductor switch 1 is non-conducting, terminals 81 and 82 receive an input AC signal from power terminals 01 and 02 of main semiconductor switch 1. SCR controlled bridge rectifier 8 provides a rectified signal (shown in FIG. 3 as waveform 2) across terminals 83 and 85. As shown in FIG. 3, the rectified signal across terminals 83 and 85 is a half-wave signal at twice the frequency of the input AC signal.

Liu Switch 300 takes advantage of an impedance effect of the present invention, referred below as "Liu's touch signal complementary effect" (or "LTS" effect), which is further explained below. In FIG. 1, Liu Switch 300 includes touch panel 17, which is electrically coupled to trigger and control circuit 200. When touch panel 17 is contacted by an external agent (e.g., a human operating the switch), an electrical path is created as the result of the LTS effect for triggering trigger and control circuit 200. The LTS effect is explained with the aid of FIGS. 2a and 2b.

FIG. 2a shows equivalent circuits 250 and 250', each representing a human body in contact with a touch panel (i.e., touch panel 17 or 19). Under certain environmental conditions, equivalent circuit 250 is dominated by an equivalent resistance (i.e., resistor R23) representing the leakage path to ground, varying from about 30 Mega-ohms down to 100 ohms. The electrical signal intensity resulting from the LTS effect of this resistive component is shown in FIG. 2b by curve $S_a$. Similarly, under other environmental conditions, the human body provides a medium to high of impedance (i.e., approximate from 30 Mega-ohms to 300 Mega-ohms or higher). In this range, equivalent circuit 250 is dominated by equivalent capacitor C24 with distributed reactance $X_c$. The electrical signal intensity resulting from the LTS effect of this capacitive component is shown in FIG. 2b as curve $S_b$. To properly harness this LTS effect, trigger and control circuit 200 provides an anti-parallel diode connected between a common ground and an emitting junction of an input transistor of gain circuit 11.

Under even higher impedance conditions, the human body can reach an impedance of more then 300 Mega-ohms or higher. At such high impedance, equivalent circuit 250 is dominated by inductive signal source AT26, providing an electrical signal from the stray electromagnetic fields of the ambience. Such electromagnetic fields result from various signal sources in a wide spectrum, from low frequency hum signals (e.g., 50(100)Hz or 60(120)Hz hum) to signals in the VHF or UHF band, and perhaps from static electricity as well, under certain conditions. Inductive signal source AT26 provides an electrical signal resulting from a superposition of such electromagnetic fields which can be detected by gain circuit 11 of trigger and control circuit 200. The electrical signal intensity resulting from the LTS effect is shown in FIG. 2b as curve $S_c$.

The combined LTS effect of resistor R23, capacitor C24 and inductive signal source AT26 of FIG. 2b is shown in FIG. 2b as curve $S_d$. In FIG. 2b, a region labeled "dull" represents the region in which the electrical intensity at panel 17 is insufficient to trigger reliably trigger and control circuit 200. As shown by curve $S_d$, the electrical signal strength of the combined LTS effect of equivalent circuit 250 is above the "dull" region over virtually all practical impedances. Significantly, where the resistive component (i.e., $S_a$) falls below into the dull region, the capacitive component (i.e., $S_b$) maintains curve $S_d$ significantly above the dull region. Similarly, where both the resistive and capacitive components (i.e., curves $S_a$ and $S_b$) fall into the dull region, the inductive signal source component (i.e., $S_c$) maintains curve $S_d$ above the dull region. Thus, the combined LTS effect allows Liu Switch 300 to be reliably switched over practically all impedances of the human body, substantially regardless of the environmental conditions.

Equivalent circuit 250' operates in substantially the same manner as equivalent circuit 250 described, and thus description here of its operations is omitted.

The operation of Liu Switch 300 is next discussed. Initially, i.e., when Liu Switch 300 is first powered up, both capacitor C1 of state memory and capacitive triggering circuit 12 and capacitor C4 (and capacitor C4') of the initialization and power recovering reset circuit 15 are in a discharged state.

When an AC power signal is impressed across main semiconductor switch 1 and load 2 (i.e., "power-up"), terminals 81 and 82 receive the AC signal. The twin half-wave DC signal resulting from rectification by SCR controlled bridge rectifier 8—this half-wave DC signal has a frequency twice that of the AC signal-appear across terminals 121 and 122. Capacitor C1 of state memory and capacitive triggering circuit 12 becomes fully charged almost immediately. Initially after power-up, the charging current pulse is shunted through forward diode gate 13 to capacitor C4 and C4' of initialization and power recovering reset circuit 15. The voltage at control terminal 122 does not significantly rise to cause a signal to pass through attenuator 9 to trigger terminal 84 of SCR controlled bridge rectifier 8 to trigger semiconductor switch 1. Thus, the twin half-wave DC voltage maintains capacitor C1 of state memory and capacitive triggering circuit 12 at a fully charged state. In this "OFF" state, no current flows in trigger and control circuit 200.

In the "OFF"-state, when a person touches touch panel 19, however, an "OFF"-state feedback effect is created. Gain circuit 14 provides a low-impedance path between terminals 141 and 142 to discharge and to maintain discharged capacitors C4 and C4' of initialization and power recovery circuit 15. Discharged capacitors C4 and C4' prevents any signal at terminal 122 to trigger main semiconductor switch 1, thus main semiconductor switch 1 remains non-conducting The voltage across the two terminals of semiconductor switch 1 maintains capacitor C1 in a fully charged state. As capacitor C1 in state memory and capacitive trigger circuit 12 remains fully charged, no trigger signal is propagated to the trigger terminal 84 of SCR controlled bridge rectifier 84 and hence to main semiconductor switch 1. Consequently, main semiconductor switch 1 remains stable in the "OFF" state.

When control and trigger circuit 200 is in the "OFF" state, first and second gain circuits 11 and 14 are both in a current cutoff state, since no signal input is received. (So long as they are not contacted, panels 17 and 19 do not provide electrical signals). In addition, SCR controlled bridge rectifier 8 is in a current cutoff mode when it is not triggered. Thus, Liu Switch 300 has no leakage current to load 2 in the "OFF"-state of Liu Switch 300.

While in the "OFF" state, when an external agent (e.g., a human hand) touches touch panel 17, an electrical signal is provided to Liu Switch 300 at input terminal 113 of first gain circuit 11, in accordance with the LTS effect discussed above. This electrical signal causes gain circuit 11 to provide a low impedance path between terminals 121 and 122 of state memory and capacitive triggering circuit 12. As a result, capacitor C1 within state memory and capacitive triggering circuit 12 rapidly discharges, and the DC signal at terminal 121 is coupled to terminal 122. Even if the electrical signal is removed, the charging current of capacitor C1 creates a pulse that is shunted through gain circuit 11 and diode gate 13 to rapidly and fully charge capacitors C4 and C4' of initialization and reset circuit 15 and triggers SCR controlled bridge rectifier 8, thereby causing semiconductor switch 1 to become conducting. Thereafter, as explained below in the next half wave, the brief charging current of capacitor C1 at zero crossing of the AC signal creates a trigger pulse which continues to be sufficient to trigger SCR controlled bridge rectifier 8 at trigger terminal 82 of main semiconductor switch 1. (At this time, capacitor C4 is fully charged, so that the triggering pulse is provided entirely to the SCR controlled bridge rectifier 8.) This trigger pulse triggers SCR1 to cause main semiconductor switch 1 to become conducting, thus placing Liu Switch 300 into an "ON" state, and providing power across load 2. In addition, an "ON" state feedback effect is initiated. The "ON" sate feedback effect depends upon: (a) while SCR1 and main semiconductor switch 1 are causing each other to conduct a low impedance path for discharging capacitor C1 is provided between terminals 121 and 122, thus maintaining capacitor C1 in a discharged state; and (b) main semiconductor switch 1 remains in a conducting state, except at zero-crossings of the input AC signal.

At a zero-crossing, main semiconductor switch 1 becomes non-conducting, which allows the next half-wave of the twin half-wave DC signal to momentarily appear across terminals 121 and 122, thus charging capacitor C1 almost immediately. The charging current pulse is coupled to terminal 122 and through attenuator 91, to trigger terminal 84 of SCR controlled bridge rectifier 8. Thus, the charging current pulse causes main semiconductor switch 1 to become conducting again until the next zero-crossing of the input AC signal.

While in the "ON" state, when a human (e.g. a hand) contacts touch panel 19, an electrical signal is provided to second gain circuit 14, in accordance with the LTS effect discussed above. A low impedance path is provided across the "Liu's Network" in initialization and recovering reset circuit 15. As a result, capacitor C4 discharges through the low impedance path rapidly. Through diode gate 13, the low impedance-path also interrupts the "ON" state feedback effect by shunting the trigger pulse in control terminal 122 to common ground. Thus, at the next zero-crossing, when main semiconductor switch 1 becomes non-conducting, the absence of the trigger pulse places Liu Switch 300 in an "OFF" state, while the twin half-wave DC signal appearing across terminals 121 and 122 recharges capacitor C1. A fully charged capacitor C1 prevents a trigger pulse to be created at control terminal 122, and hence prevents main semiconductor switch 1 from triggered into a conducting mode, until the next contact at touch panel 17.

Thus, since Liu Switch 300 conducts no current during the "OFF"-state, and is short-circuited during the "ON" state (except at brief instances at zero-crossings of the AC signal), Liu Switch 300 does not require a power supply circuit for proper operation. Consequently, a two-terminal network solid state switch which operates in the same manner as a conventional mechanical single-pole switch is realized.

According to the present invention, the Liu's Network has is characterized by multiple time constants. For example, in the implementation shown in FIG. 7a: (a) Capacitor 4 is discharged through resistor R8 at a rate characterized by a large predetermined time constant; (b) Capacitor 4 is rapidly charged at a rate characterized by a small time constant (relative to the predetermined time constant above) when charged by a current from control terminal 122 through diode gate 13; and (c) Capacitor 4 is rapidly discharged at a rate characterized by a small time constant (relative to the predetermined time constant above) when discharged by the low impedance path of gain circuit 14.

The small time constant in charging through diode gate 13 (i.e., in (b) above) allows the Liu's Network to serve as a dynamic energy absorber, to absorb shock, noise spike, and surge pulses which appear at control terminal 122. With this quality, a very high stability in the "ON" and "OFF" states of Liu Switch 300 is achieved. The Liu's Network discharges through the low impedance path provided by second gain circuit 14 with a small time constant, so as to allow Liu Switch 300 to switch off quickly in response to contact at touch panel 19. In addition, the Liu's Network can achieve a desirable safety function. For example, in a conventional mechanical power switch, when the switch conducts (turns "ON"), a load is running (e.g., a heater, or a electric tool, a machine, etc.). However, during a power interruption, the load may be left in an operating mode when the power was interrupted. Thus, when power resumes at a later time unexpectedly, the load continues the interrupted operation. The resumption of power to a load left in an operating mode is the cause of accidents, causing fires, bodily injury and property damages.

The Liu's Network includes resistor (R8) to provide the predetermined discharge time constant. If the AC power is interrupted while Liu Switch 300 is in the "ON" state, capacitor C4 discharges through resistor R8. The predetermined time constant maintains the charge on capacitor 4 for a predetermined time period. If the AC power recovers during this predetermined time period (e.g., from a few to tens of seconds), capacitor 4 is unable to completely absorb the charging current of capacitor C1, thereby allowing a trigger pulse to reach terminal 84 (FIG. 1) to trigger SCR1 and hence allowing Liu Switch 300 to resume its former "ON" state. However, if the AC power recovers only after the predetermined time period has elapsed, capacitor C4 of the Liu's Network is substantially discharged through resistor R8, such that the charging pulse of capacitor C1 is shunted through diode gate 13 to capacitor C4. As a result, when AC power recovers after the predetermined period has elapsed, Liu Switch 300 recovers into the "OFF" state and remains stable in the "OFF" state indefinitely. Thus, the Liu's Network avoids load 2 resuming operation unexpectedly when power recovers, thus avoiding accidents and harm.

When included in trigger and control circuit 200 (FIG. 1), "beep" circuit 21 indicates by sound successful switching of Liu Switch 300.

When included in trigger and control circuit 200, overcurrent protection circuit 16 monitors the current in current detector 5, and provides an output control signal at input terminal 144 of gain circuit 14 when the current in current detector 5 exceeds a predetermined threshold. As discussed above, the control signal at terminal 144 interrupts the "ON" state of Liu Switch 300.

When included in trigger and control circuit 200, optocoupler circuit 22 or 23 allow Liu Switch 300 to be used in a multipoint random control system. As shown in FIG. 1, optocoupler circuit 22 includes input terminals 223, 224 and 225, and provides output terminals 221, 222, 226 and 228. Terminal 225 is coupled to an external ground reference, terminals 221 and 226 are coupled respectively through terminals 121 and 122 to gain circuit 11, and terminals 222 and 228 are coupled respectively through terminals 141 and 142 (also common ground) to gain circuit 14. When a signal (AC or DC) appears across terminals 223 and 225, an optically isolated low impedance signal path is provided between terminals 221 and 226, thereby triggering the "ON" state of Liu Switch 300, in the manner explained above. Similarly, when a signal appears across terminals 224 and 225, an optically isolated low impedance path appears between terminals 222 and 228, thereby triggering the "OFF" state of Liu Switch 300. Using optical isolation, the output terminals 221, 222, 226 and 228 are each isolated by very high impedance from input terminals 223–225.

Optocoupler circuit 23 is similar to optocoupler circuit 22, except that an additional external ground signal 237 is provided so that highly isolated electrical paths are provided between terminals 223 and 235, 234 and 237, 231 and 236, and 232 and 238. When a signal (AC or DC) appears across terminals 233 and 235, an optically isolated low impedance signal path is provided between terminals 231 and 236, thereby triggering the "ON" state of Liu Switch 300, in the manner explained above. Similarly, when a signal appears across terminals 234 and 237, an optically isolated low impedance path appears between terminals 232 and 238, thereby triggering the "OFF" state of Liu Switch 300.

Several implementations of Liu Switch 300 are described below. To facilitate cross-referencing among the diagrams, reference numerals used in FIGS. 4–13 that correspond to reference numerals used in FIG. 1 indicate elements or terminals identified in FIG. 1 in these implementations.

Figure 4:
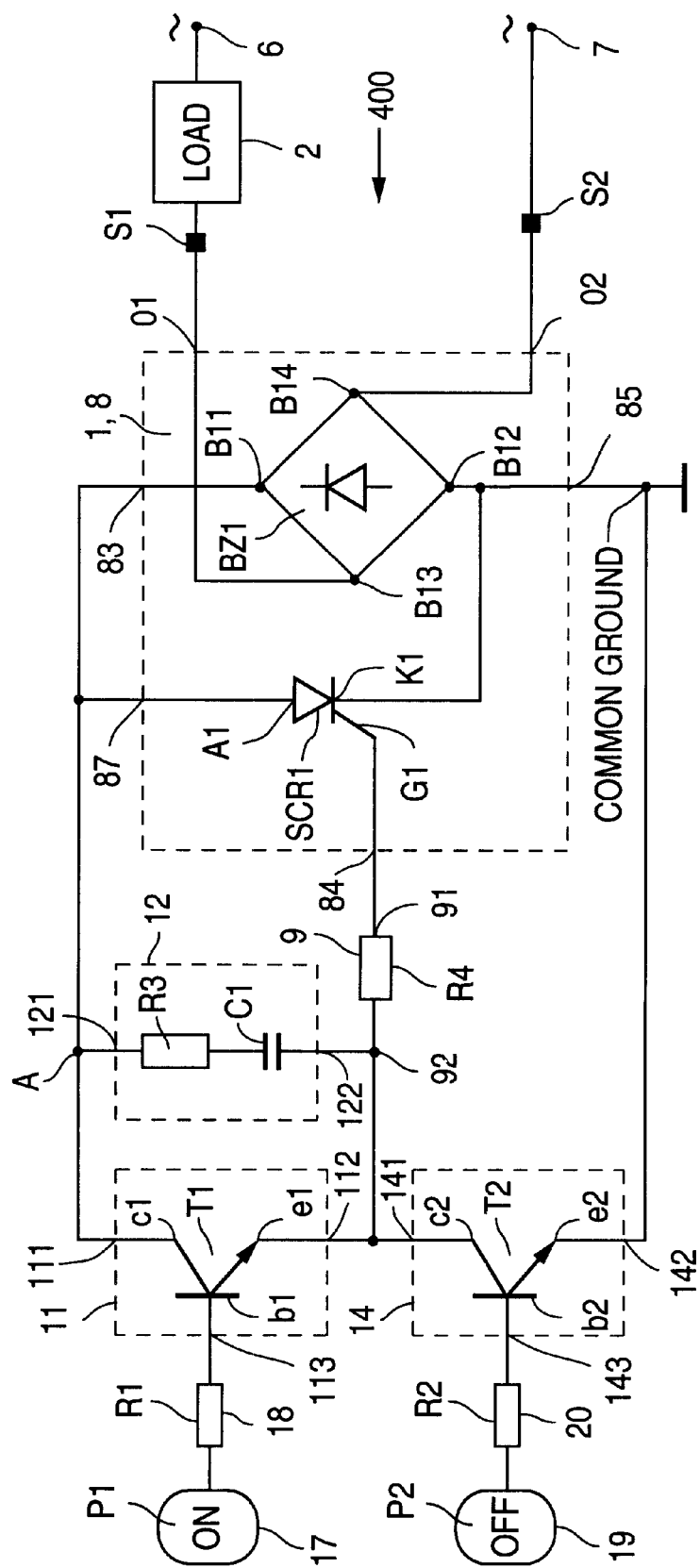
FIG. 4 shows on the embodiment of the present invention in a circuit 400, in which SCR controlled bridge rectifier 8 and main semiconductor switch 1 are implemented into a combined SCR-diode bridge circuit (1,8), and first gain circuit 11 is implemented by transistor T1.

FIG. 4 shows one embodiment of the present invention in circuit 400, in which SCR controlled bridge rectifier 8 and main semiconductor switch 1 are implemented into a combined SCR-diode bridge circuit (1,8). As shown in FIG. 4, a diode bridge BZ1 and an SCR1 realize the functions of SCR controlled bridge rectifier 8 and main semiconductor switch 1 of FIG. 1. State memory and trigger circuit 12 is realized by series-connected resistor R3 and capacitor C1. Current-limiters 18 and 20 are realized by resistors R1 and R2. Gain circuits 11 and 14 are realized by NPN bipolar transistors T1 and T2. Attenuator 9 is realized by resistor R4.

During the "OFF" state, a rectified signal appears across terminals 83 and 85 and capacitor C1 is charged. When a human person contacts touch panel 17, a contact signal results from the LTS effect which turns on NPN transistor T1. Conducting transistor T1 discharges capacitor C1 and couples the twin half-wave DC signal at terminal 87 to terminal 92. Through resistor R4, the twin half-wave DC signal is provided to gate terminal G1 of SCR1, thus triggering SCR1 into conduction. Conducting SCR1 provides a short circuit between terminals 01 and 02 (i.e., main semiconductor switch 1), thus providing an AC signal across load 2, maintaining capacitor C1 in a discharged state, and incurring a voltage drop ($V_{SAT-ON}$) equal to the sum of two forward-biased drops in diode bridge BZ1 and the voltage drop across forward-biased SCR1 (i.e., 2.4–4.0 volts). When the AC signal crosses zero, SCR1 shuts off, so that capacitor C1 is charged by the next twin half-wave of the AC signal, thus providing a charging current which triggers SCR1 back into conduction. Conducting SCR1 provides the AC signal across load 2 once again. This regenerating feedback process maintains Liu Switch 300 in the "ON" state. When a human contact touch panel 19, a contact signal from the LTS effect turns NPN transistor T2 into conduction, thus shorting terminal 92 to common ground, interrupting the feedback process described above, and setting Liu Switch 300 to the "OFF" state.

Figure 5:
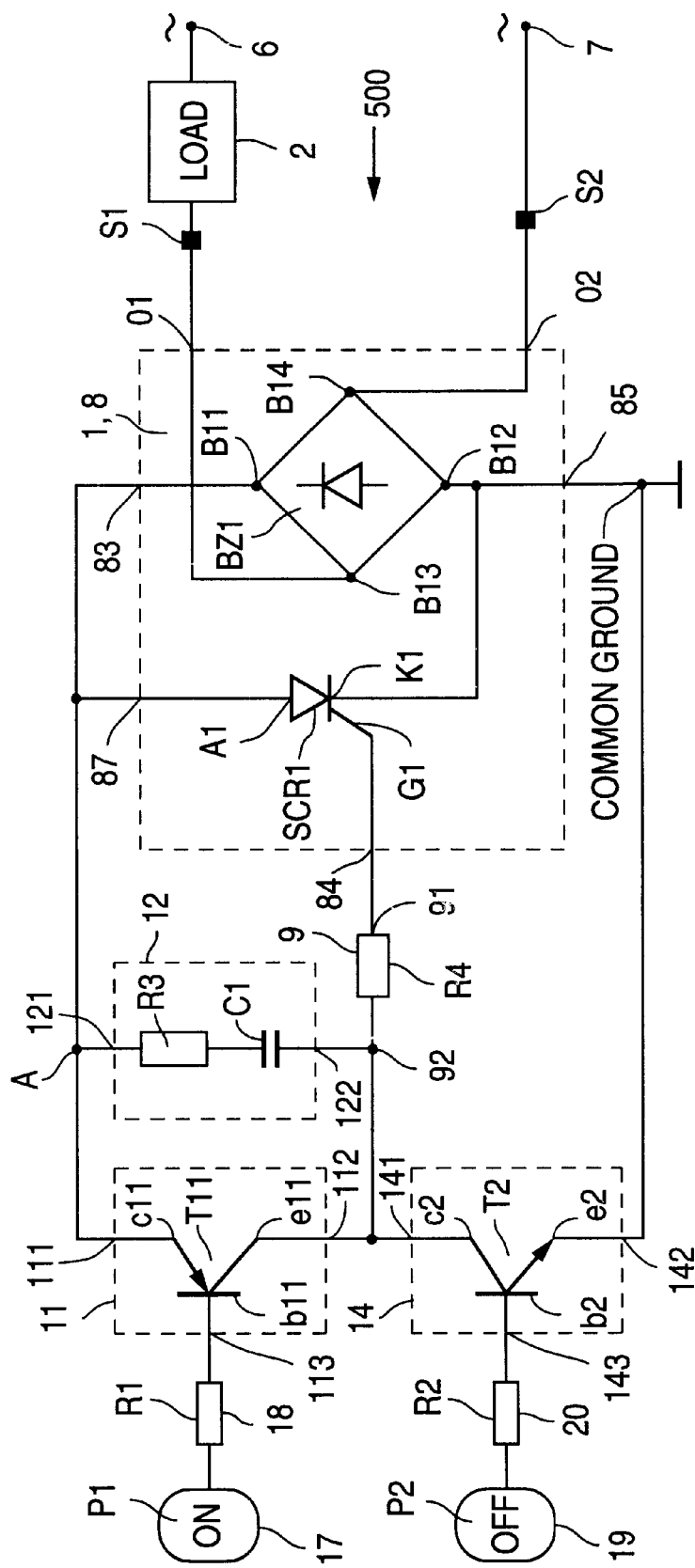
FIG. 5 shows one embodiment of the present invention in circuit 500, in which SCR controlled bridge rectifier 8 and main semiconductor switch 1 are implemented into a combined SCR-diode bridge circuit (1,8), and first gain circuit 11 is implemented by transistor T11.

FIG. 5 shows another embodiment of the present invention in circuit 500, which is substantially identical to circuit 400, except that PNP transistor T11 in circuit 500 replaces NPN transistor T1 of circuit 400. Otherwise, operation of circuit 500 is virtually identical to circuit 400 described above.

Circuits 400 and 500 have several disadvantages. First, a relatively large "ON" state voltage drop (2.4–4.0 volts) results in relatively large power dissipation in Liu Switch 300, requiring a heat sink for proper high-current operation, and reducing the voltage seen across load 2. Second, circuits 400 and 500 provide a Liu Switch which initializes in the "ON" state when coupled in the first instant to an AC signal source.

Figure 6A:
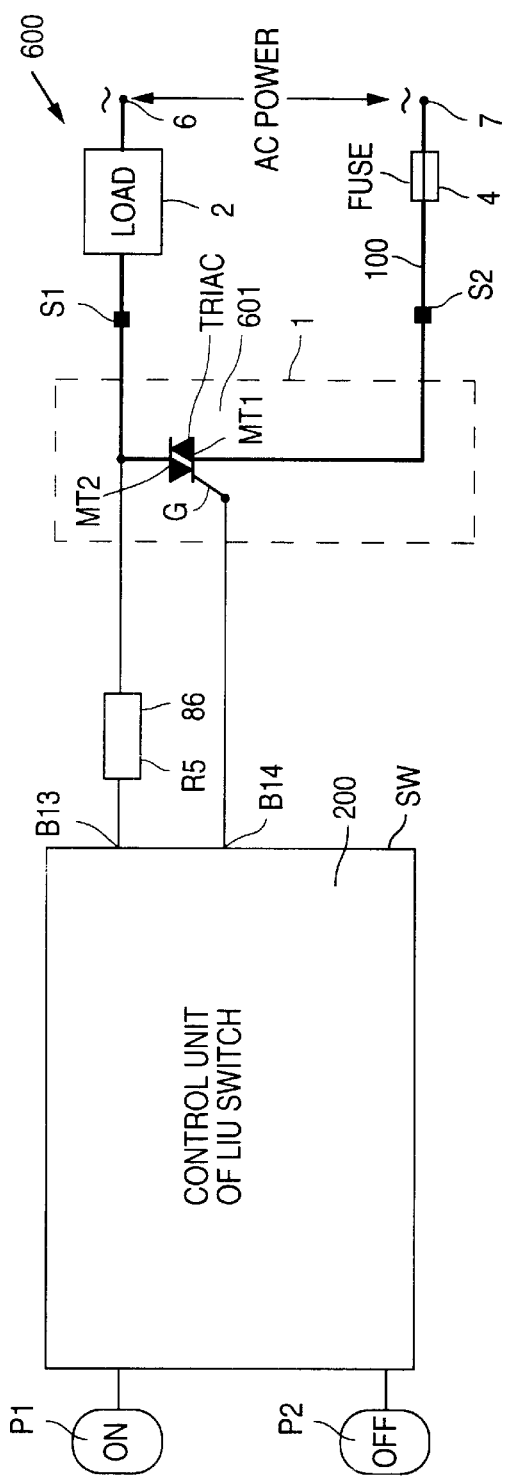
FIG. 6a shows on the embodiment of the present invention in circuit 600, in which main semiconductor switch 1 is implemented by TRIAC 601.
Figure 6B:
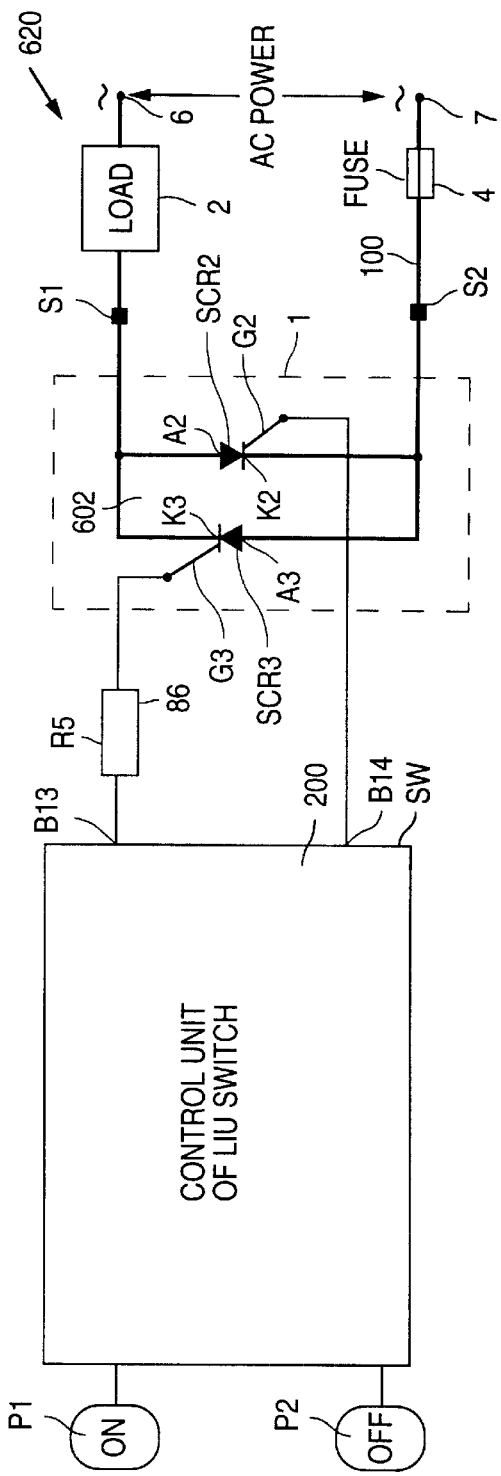
FIG. 6b shows one embodiment of the present invention in circuit 620, in which main semiconductor switch 1 is implemented by antiparallel SCRs 602 (SCR2 and SCR3).

To minimize the "ON" state voltage drop ($V_{SAT-ON}$) semiconductor switch 1 can be implemented by a TRIAC or anti-parallel SCRs, as shown in FIGS. 6a and 6b. FIG. 6a shows one embodiment of the present invention circuit 600, in which main semiconductor switch 1 is implemented by a triode AC switch (TRIAC) 601. As shown in FIG. 6a, terminals B13 and B14 (i.e., terminals 81 and 82 of FIG. 1) of diode bridge BZ1 are coupled to gate terminal G and a second anode MT2 respectively. Current-limiting resistor 86 can be inserted in series between diode bridge BZ1 and TRIAC 601 at either terminals B13 and B14 to protect the gate terminal of TRIAC 601. During the "ON" state, the "ON" state voltage drop ($V_{SAT-ON}$) is between 0.8 volt to 1.6 volts. TRIAC 601 turns "OFF" at the AC signal's zero-crossing, after a high impedance is imposed across terminals G and MT2 (SCR1 non-conducting).

FIG. 6b shows on the embodiment of the present invention in circuit 620, in which main semiconductor switch 1 is implemented by circuit 602 which is implemented by SCRs (i.e., SCR2 and SCR3) in an antiparallel configuration. Each SCR in circuit 602 is capable of carrying higher current than SCR1 of SCR controlled bridge rectifier 8. As shown in FIG. 6a, terminals B13 and B14 (i.e., terminals 81 and 82 of FIG. 1) of diode bridge BZ1 are coupled to gate terminals G3 and G2, respectively. As in circuit 600 of FIG. 6a, current-limiting resistor 86 can be inserted in series between diode bridge BZ1 and antiparallel diodes SCR3 and SCR2 at either terminals B13 and B14 to protect the gate terminals G2 and G3. During the "ON" state, a trigger current is created between cathodes K3 and K2 of SCR3 and SCR2, respectively, which flows through the path formed by gate terminal G3 of SCR3, bridge rectifier BZ1, SCR1 and gate terminal G2 of SCR2. The trigger current alternately triggers SCR2 and SCR3 into conduction mode. During the "ON" state, the "ON" state voltage drop ($V_{SAT-ON}$) is thus approximately 1 volt. Main semiconductor switch 1 turns "OFF" at the AC signal's zero-crossing, after a high impedance is imposed across terminals G2 and G3 (SCR1 non-conducting), thereby setting SCR2 and SCR3 in non-conducting states.

By using power components (e.g., TRIAC 601, and SCR2, SCR3 of switch devises 602,) in circuits 600 and 620, the current that can be provided to load 2 is easily expanded over the corresponding currents deliverable by circuits 400 and 500 of FIGS. 4 and 5. In addition, because of the low "ON" state voltage drop across Liu Switch 300, the power dissipation is also diminished, as compared to circuits 400 and 500 discussed above, for the same current load.

Figure 7A:
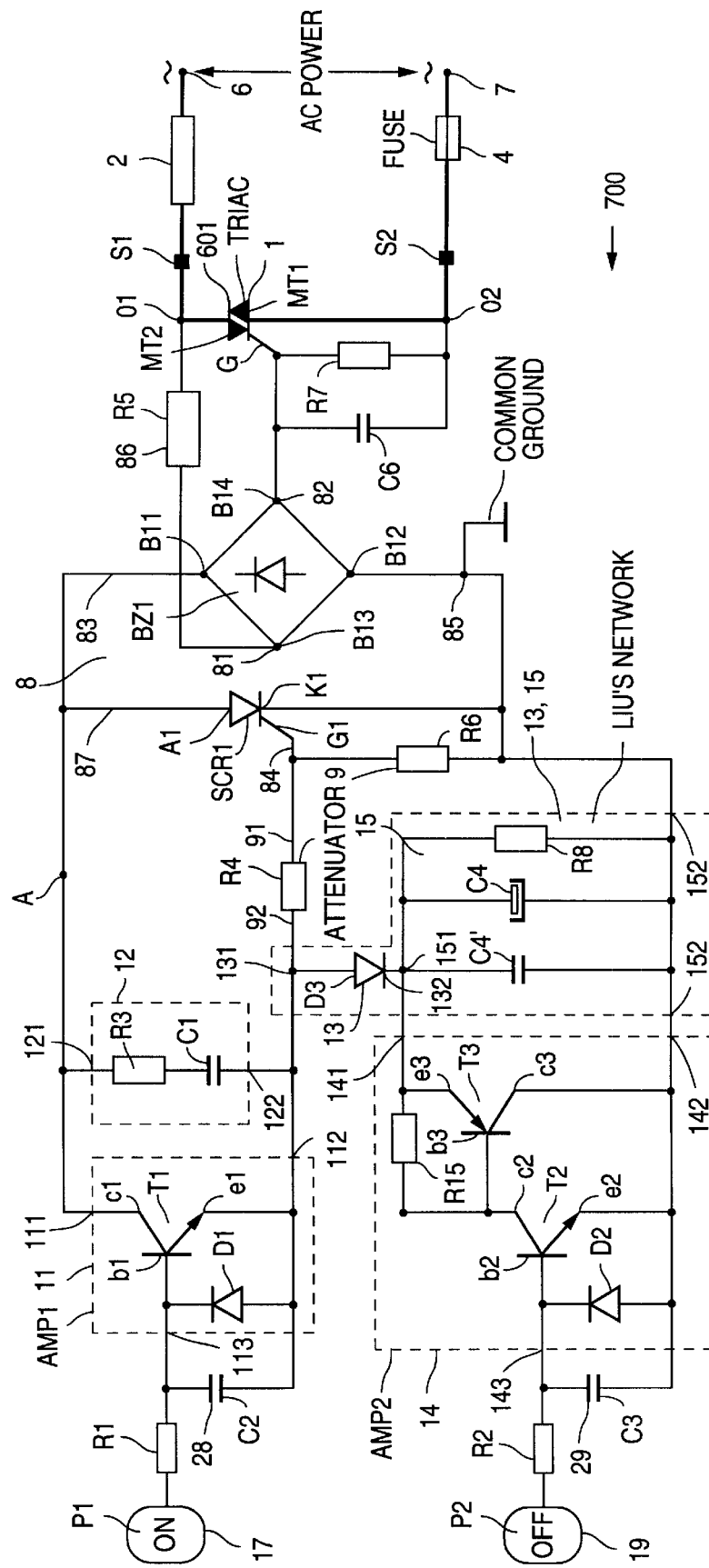
FIG. 7a shows another embodiment of the present invention in circuit 700, in which is provided a realization of initialization circuit, includes a Liu's Network 13,15.

FIG. 7a shows another embodiment of the present invention in circuit 700, in which is provided a realization of initialization circuit and power recovering reset circuit 15 and diode gate 13. Initialization circuit and power recovering reset circuit 15 and diode gate 13 is implemented by diode D3, resistor R8, and capacitors C4 and C4', referred below as "Liu's Network". In addition, circuit 700 implements attenuator 9 by a voltage divider formed by resistors R4 and R6. In circuit 700, gain circuit 14 is provided by a complementary cascaded amplifier including resistor R15, PNP transistor T3, and NPN transistor T2. SCR controlled bridge rectifier 8 and main semiconductor switch 1 are implemented by a circuit similar to circuit 600, except that a bypass filter formed by capacitor C6 and resistor R7 is provided at the gate terminal of TRIAC 601. Gain circuit 11 and state memory and trigger circuit 12 are provided as in circuit 400 above. Filter circuits 28 and 29 are each implemented by a capacitor (C2 or C3) connected in parallel with a diode (D1 or D2). In each of filter circuits 28 and 29, the diode (e.g., D1) is connected in an antiparallel fashion to the emitter junction of the gain transistor (e.g., transistor T1). In this configuration, the diode performs at least three functions: (a) providing a negative path for to increase the distributive capacitive component ($S_b$) of the LTS effect; (b) protecting the emitter junction of the gain transistor; and (c) detecting a peak in the equivalent inductive signal source component ($S_c$) of the LTS effect.

In circuit 700, capacitor C4 provided in Liu's Network has a much larger capacitance that capacitor C1 of state memory and trigger circuit 12. In this embodiment, capacitor C4 can be implemented by an polarized electrolytic capacitor. Since a large electrolytic capacitor has a parasitic inductance, an unpolarized capacitor C4' is provided in Liu's Network to provide a fast response time to the Liu's Network.

Initially, i.e., when an AC power signal is first imposed across Liu Switch 300, both capacitors C4 and C1 are uncharged. As described above, capacitor C1 is fully charged within a very short period of time after the rectified signal across terminals 83 and 85 crosses zero. However, as capacitor C4 remains relatively uncharged, the charging current of capacitor C1 is shunted to charge capacitor C4 through forward-biased diode D3, so that a sufficient triggering current pulse is not seen at input terminal 92 of attenuator 9, thus preventing triggering Liu Switch 300 into the "ON" state. During the "OFF" state of Liu Switch 300, no current thus flows in trigger and control circuit 200, as described above. (Leakage currents in gain circuits 11 and 14 are in the nano-ampere range, and thus negligible.) Resistor R8 maintains capacitor C4 in a substantially discharged state during the "OFF" state of Liu Switch 300. Thus, initialization circuit 15 provides additional stability in the "OFF" state, maintaining input terminal 122 of attenuator 9 no higher than one diode drop (i.e., about 0.7 volts) above the common ground, thereby preventing triggering of Liu Switch 300 by a momentary surge in the AC signal or by inadvertent momentary contact of touch panel 17.

As described above, when a person touches touch panel 17, capacitor C1 is discharged and the rectified signal is transmitted through the low impedance path through transistor T1 across terminals 121 and 122. This signal, even though attenuated by attenuator 9, is sufficient to trigger SCR1 of SCR controlled bridge rectifier 8, which in turn, triggers main semiconductor switch 1 to a conducting state. As the "ON" state feedback process described above maintain Liu Switch 300 in the "ON" state, a steady state is reached whereby capacitor C4 is maintained at a steady state voltage. At this time, if the AC power signal across lines 6 and 7 is suddenly interrupted, capacitor C4 discharges through resistor R8 according to the time constant determined by the capacitance and resistance values of capacitor C4 and resistor R8. Thus, by a judicious choice of these values, Liu Switch 300 can return to the "ON" state (i.e., an "ON" state memory is achieved), if the power resumes within the predetermined period of time. However, if the power resumed after the predetermined time period, capacitor C4 becomes discharged. Since discharged capacitor C4 can absorb the charging pulse of capacitor C1, as described above, a stable "OFF" state condition is created. Thus, Liu Switch 300 remains in the "OFF" state, until contact is made at touch panel 17 again.

Maintaining the "ON" state for a time period and then resetting to the "OFF" state thereafter can be exploited to provide a significant safety advantage (referred below as "Liu's function"). Many accidents with tragic consequences have been caused by electrical appliances or machinery left unattended and in the powered mode by a power outage. When the power recovers, these appliances or machinery resumes operation unattended, often leading to electrical appliance damages, accidents, fires or bodily injuries. However, with Liu's Network, Liu's function allows the electrical appliances or machinery to resume operation from a power interruption (i.e., "latched-ON"), only if power recovers within a time period during which continued operation can proceed safely, but resets to the "OFF" state beyond such time period. Liu's function thus maintains a stable "ON" state even during frequent or short-duration power interruptions.

Capacitor C2 or C2' of filter circuit 28, in conjunction with resistor R1 and the operator's equivalent impedance, forms a low-pass filter which eliminates high frequency electromagnetic interference from touch panel 17 and noise in parallel feedback from gain circuit 11 due to a surge in the rectified signal. Diode D1 serves three functions: (a) to provide an RF peak detector which enhances the inductive component ($S_c$) of the LTS effect; (b) to rectify the negative half-cycle signal current, thus improving the touch sensitivity of the touch panel towards the capacitive component ($S_b$) of the LTS effect; and (c) to protect the input terminals of the gain circuit. Capacitor C3 of filter circuit 29 performs a similar function as that performed by capacitor C2 or C2' described above.

In conjunction with resistor R5, resistor R7 and capacitor C6, which are connected in parallel at the gate terminal G of TRIAC 601, provide surge protection and suppress high frequency noise to gate terminal G of TRIAC 601 during operation. Further electromagnetic interference and noise filtering can be provided by series-connected EMI suppressers 3 and 3' (see FIG. 1), which can be provided by many forms of low-pass filters, including LC circuits formed by solenoids with ferric alloy, ferrites cores with capacitors, or commercial monolithic EMI filters.

Figure 7B:
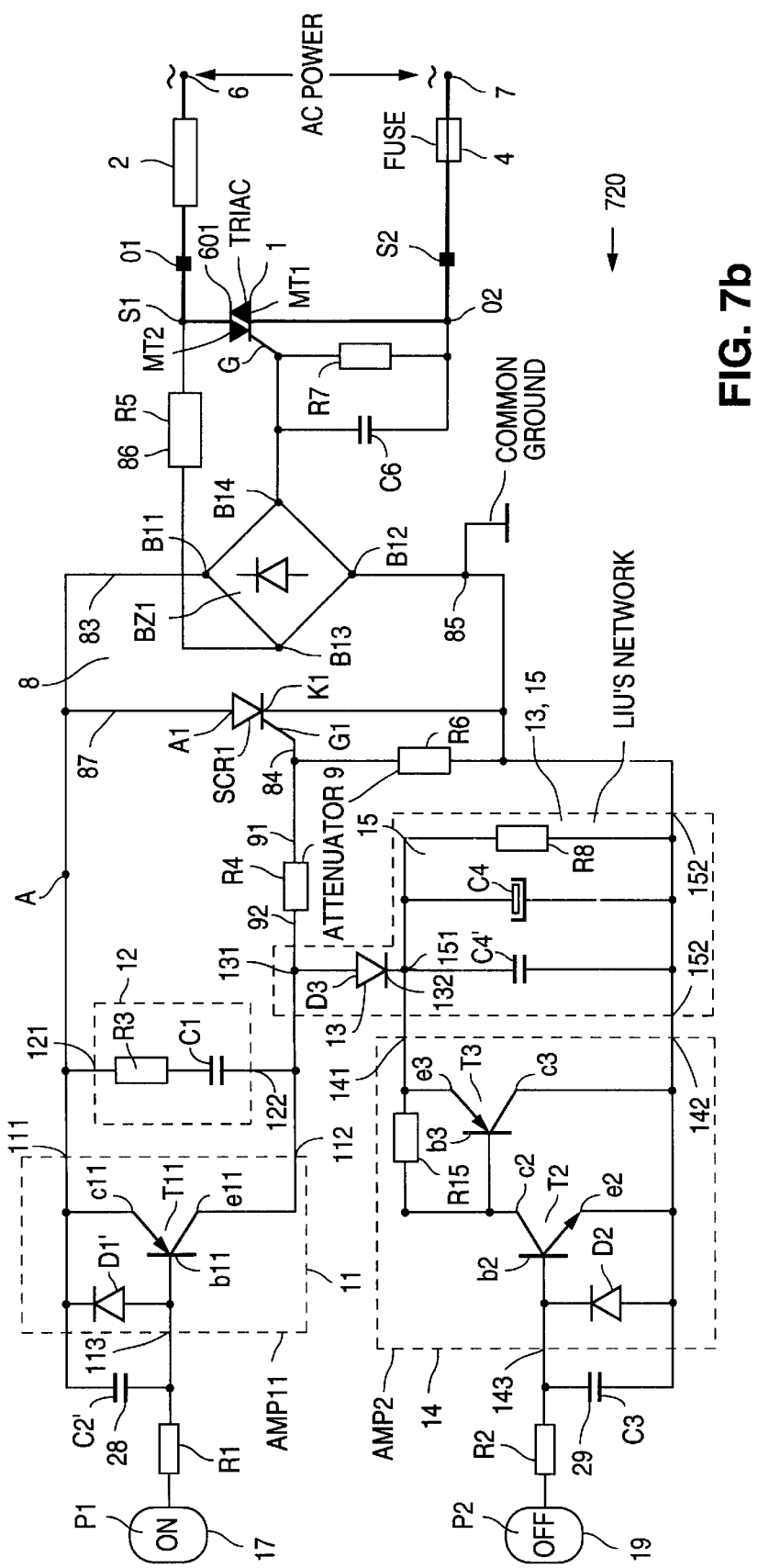
Figure 7C:
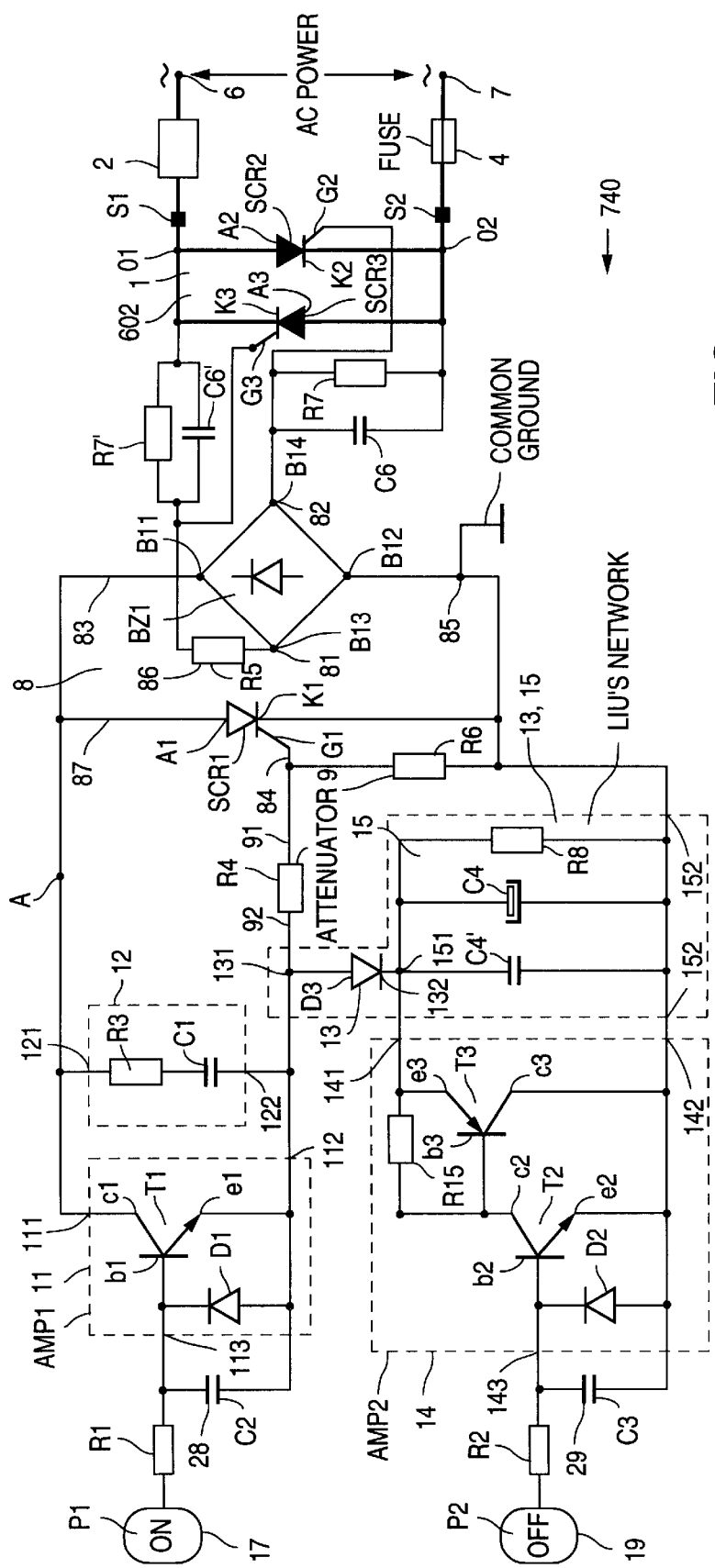
Figure 7D:
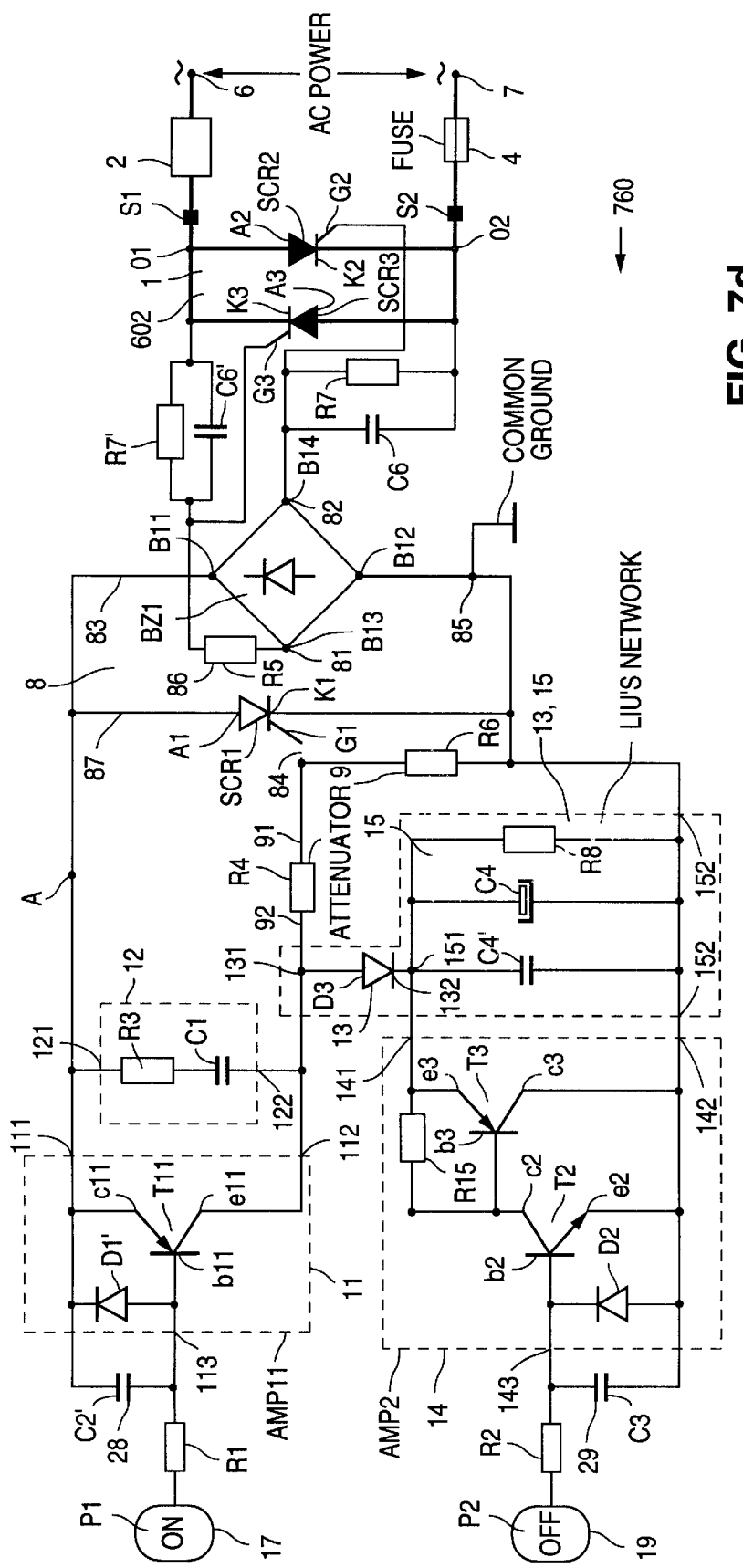

FIGS. 7b–7d show embodiments of the present invention in circuits 720, 740, and 760, each of which represents a modification of circuit 700 of FIG. 7a. Circuit 720 includes a realization of filter circuit 28 by capacitor C2' and diode D1', and a realization of gain circuit 11 by PNP transistor T11. Circuit 740 of FIG. 7c is substantially identical to circuit 700 of FIG. 7a, except that antiparallel SCR2 and SCR3 are provided for realizing main semiconductor switch 1, as in circuit 620 of FIG. 6b. Circuit 760 of FIG. 7d is substantially similar to circuit 720 of FIG. 7b, except that antiparallel SCR2 and SCR3 are provided for realizing main semiconductor switch 1, as c in circuit 620 of FIG. 6b.

Figure 8A:
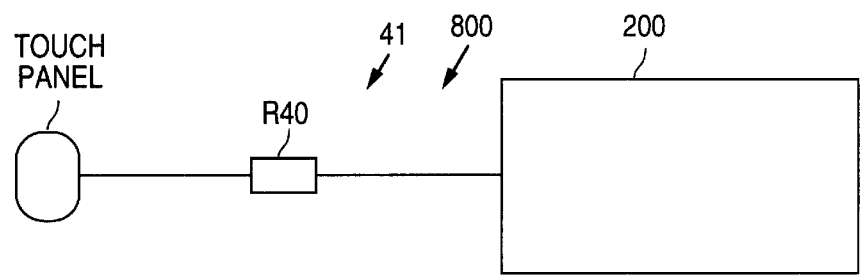
FIGS. 8a–8c show, respectively, implementations of a current limiter (i.e., current limiter 18 or 20 of FIG. 1 in each of circuits 800, 810, and 820.
Figure 8B:
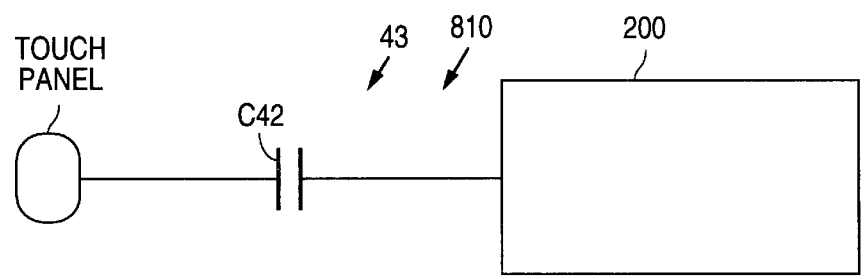
Figure 8C:
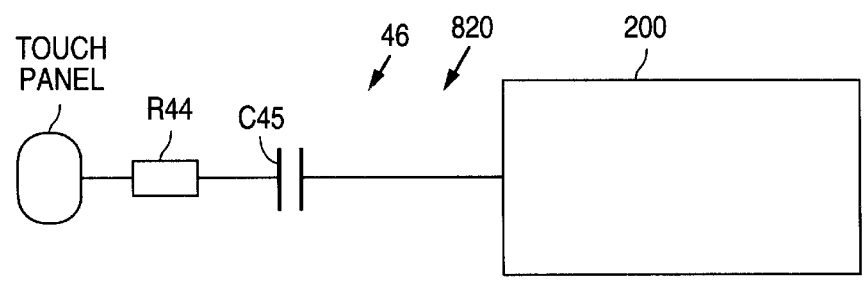

FIGS. 8a–8c show respectively circuits 800, 810 and 820 of a limiter (e.g., limiter 20). In circuit 800, a resistor R40 is provided. In circuit 810 a capacitor C42 is provided as a limiter. In circuit 820, a capacitor C45 and a resistor R44 are provided in series. Capacitors C42 and C45 can be achieved by coating a dielectric or a resistive material on the metallic or conductor surface of the touch panel.

Figure 9A:
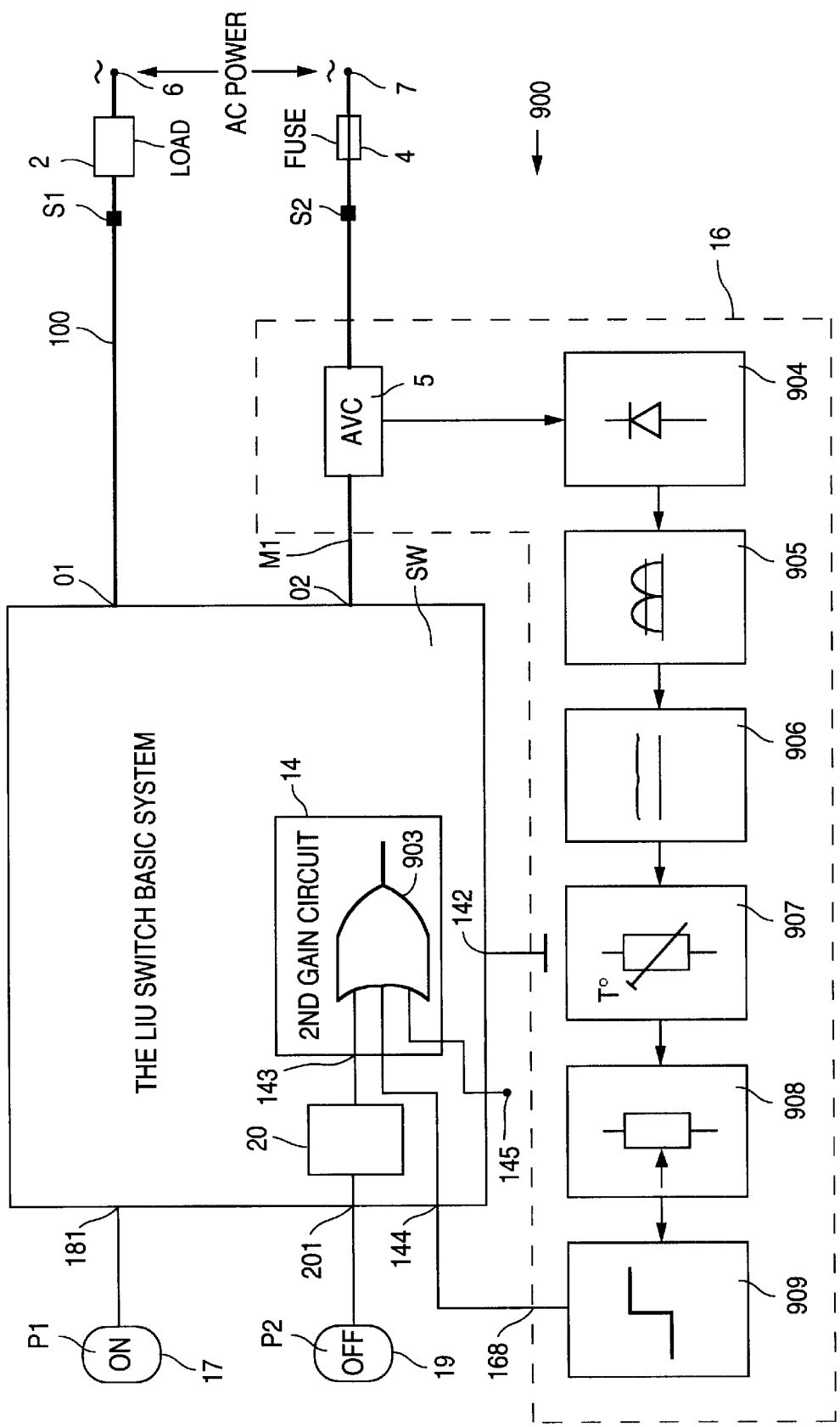
FIG. 9a shows a overcurrent protection circuit 900, including a system block diagram of overcurrent signal processing circuit 16 of the present invention.

FIG. 9a shows a system block diagram of circuit 900, representing overcurrent signal processing circuit 16 of the present invention. Circuit 900 includes a current-to-voltage conversion device (AVC) 5, an AC-DC converter or a rectifier 904, an amplitude limiter with a regulator 905, a ripple filter 906, an auto-temperature compensation and overcurrent tripping value following temperature character circuit 907, a overcurrent tripping preset circuit 908, a threshold circuit, and an OR gate 903.

AVC 5 can be provided by a current transformer or a shunt element, or another type of current-voltage conversion devices. The current-side terminals of AVC 5 are connected in series with Liu Switch 300, load 2 and fuse 4 across AC power lines 6 and 7. The output signal of AVC 5, which is representative of the current in load 2 ("main current"), is coupled at to a AC-DC converter or rectifier 904 (e.g., a half-wave rectifier, a full-wave rectifier, or a full wave bridge rectifier). The rectified signal is then regulated by regulator and amplitude limiter 905 and filtered by ripple filter 906. The resulting DC signal remains representative of the main current. Temperature automatic compensation circuit 907 is provided to adjust the resulting DC signal according to temperature-sensitive current-tripping values that follow a set of characteristics curves (iOT-T curves) The temperature-compensated DC signal is then attenuated by a voltage divider 908, and coupled to a threshold element set for a predetermined overcurrent tripping value. When an overcurrent condition occurs, an overcurrent signal is provided at terminal 144 to "OR" gate 903 to trigger second gain circuit 14, to force Liu Switch 300 into the "OFF" state for protection. Backup input terminals 145 receive one or more actuating signal for turning off Liu Switch 300. Additional backup signal inputs, if needed for performing automatic shut-off in additional protection functions, can be provided as additional input terminals of "OR" gate 903.

Figure 9B:
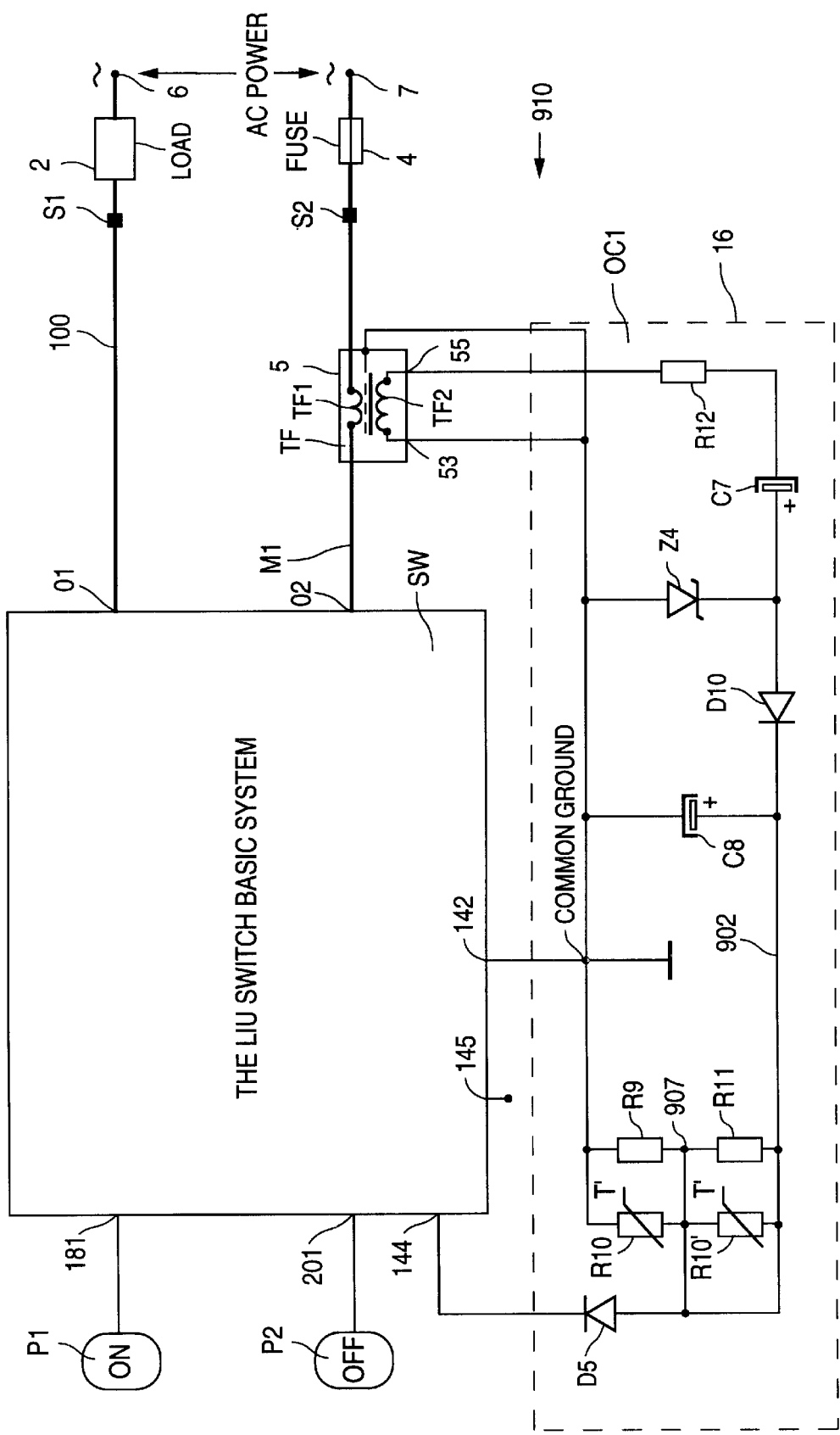
FIGS. 9b–9d show respectively circuits 910, 920 and 940 of Liu Switch 300, showing implementations of current detector 5 and overcurrent protection circuit 16.
Figure 9C:
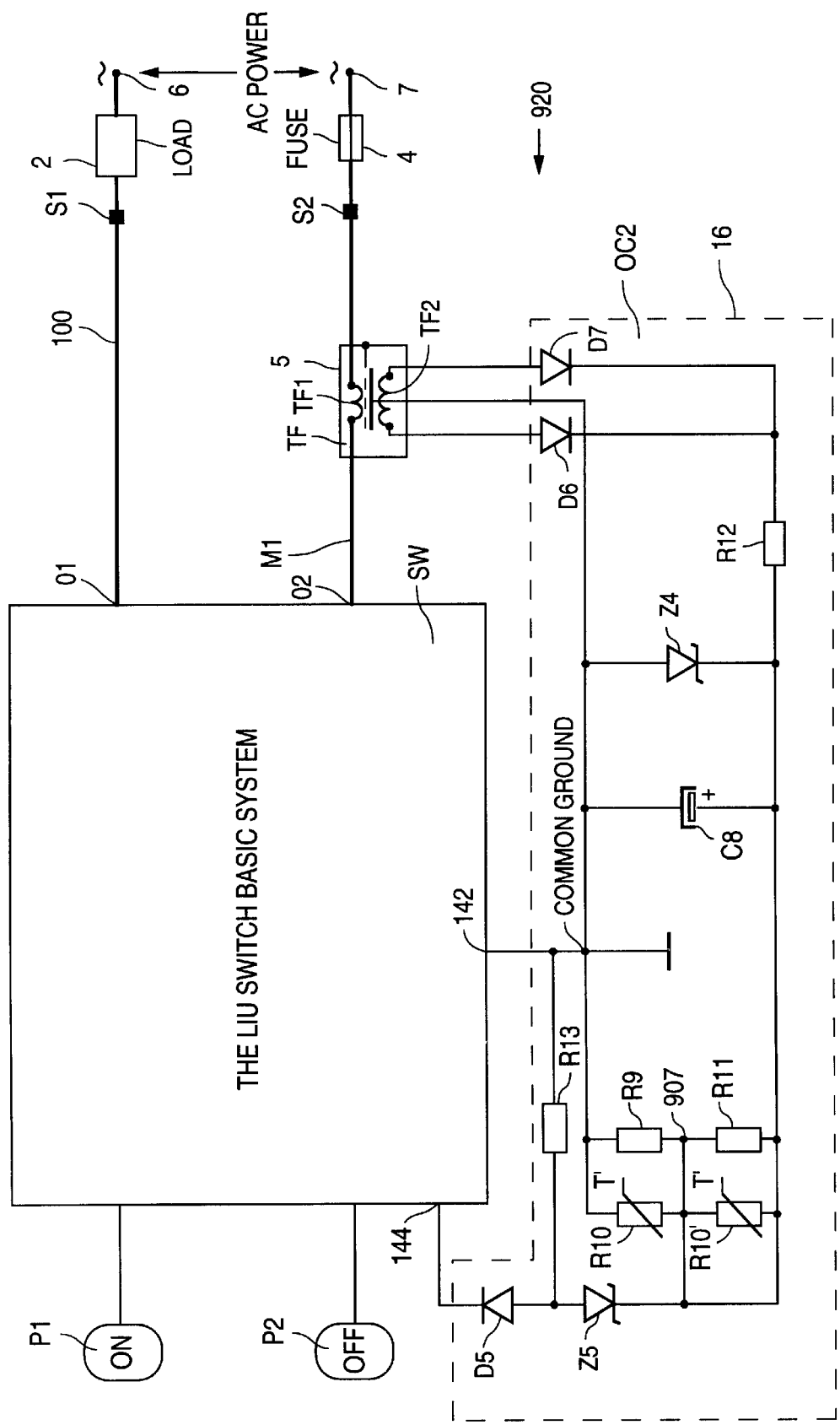
Figure 9D:
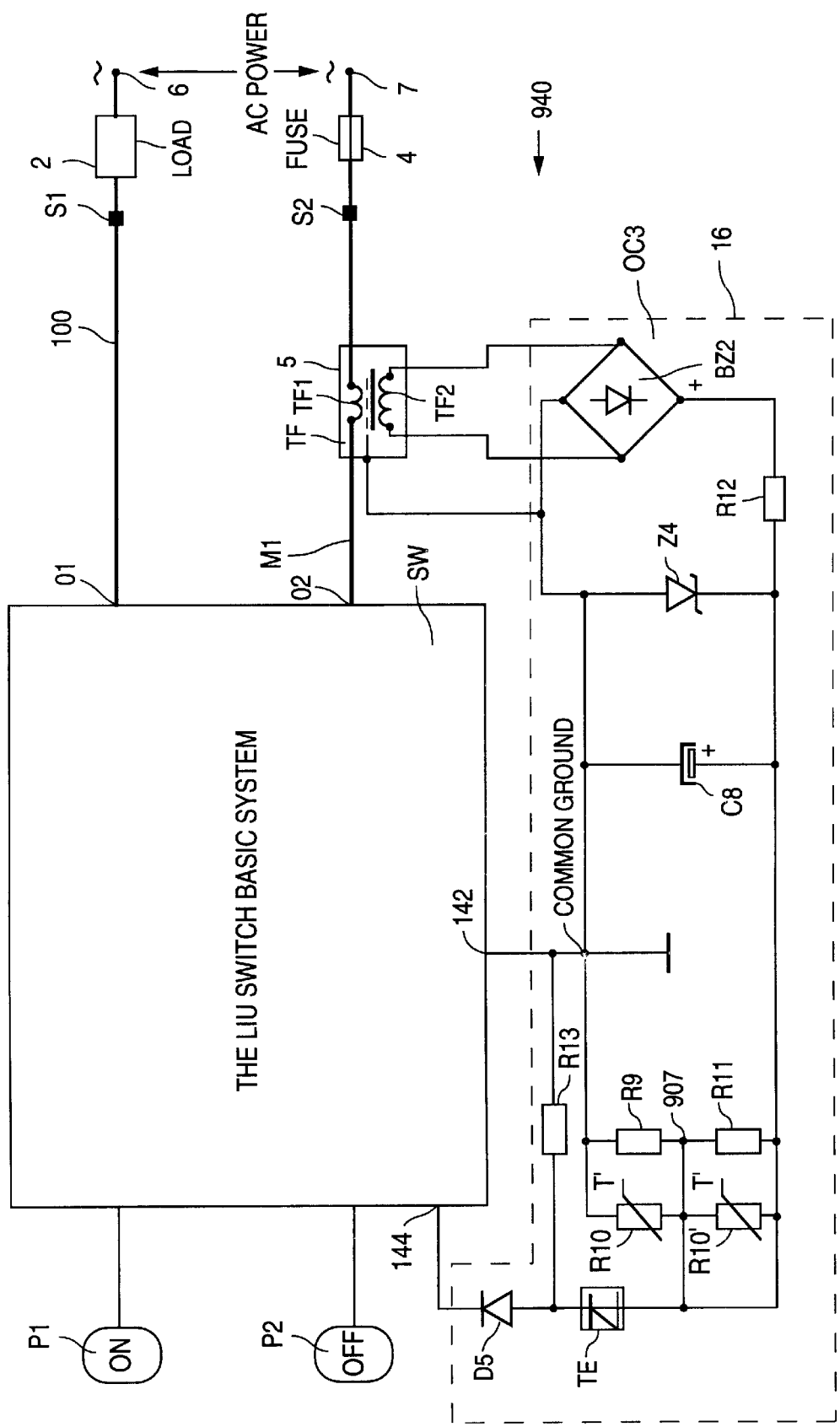

FIGS. 9b–9d show respectively realizations of three static overcurrent tripping circuits 910, 920 and 940 which can be used in Liu Switch 300. By providing overcurrent protection at Liu Switch 300 in the manner illustrated by circuits 910, 920 and 940, overcurrent protection is extended to a branch single pole switch at very low cost, thus enhances safety significantly and avoiding the inconvenience of prior art centralized overcurrent protection schemes, which results in multiple electrical circuits being affected by an overcurrent in a single electrical circuit.

In circuit 910, a small current transformer TF is provided as current detector 5. For current detection, rather than a current transformer, a shunt element or another current-voltage conversion element can also be used. In current transformer TF, the primary coil TF1 conducts the current in main semiconductor switch 1, while Secondary coil TF2 provides an AC current signal proportional to the current in coil TF1. Zener diode Z4, capacitor C7 and R12 form a voltage multiplier and half-wave rectifier. Zener diode Z4 regulates and limits the amplitude of resulting half-wave rectified signal, which is transmitted by rectifier D10 to provide a DC voltage signal at terminal 902 representative of the current through main semiconductor switch 1. This DC voltage signal, which is ripple-filtered and attenuated by capacitor C8 and resistor network 907 (consisting of resistors R9 and R11, and temperature-sensitive resistors R10 and R10') is provided through silicon diode D5 as an input signal to gain circuit 14 of Liu Switch 300. By selecting appropriate resistive values for resistors in resistor network 907, an appropriate overcurrent tripping value for Liu Switch 300 can be selected.

When the overcurrent threshold is reached, resistor R14 and diode D4 (see FIG. 13) provide a positive feedback which allows gain circuit 14 to rapidly set Liu Switch 300 into the "OFF" state. Circuit 910 enhances sensitivity to overcurrent.

Significantly, silicon diode D5's forward-bias voltage drop has a negative temperature coefficient (i.e., diode D5's forward-bias voltage drop across its terminals decreases as temperature increases). Thus, diode D5 provides a lower tripping threshold at a higher temperature. Temperature-sensitive devices (e.g., thermisters R10 and/or R10') provide dynamic characteristics of temperature-dependent overcurrent tripping points, and thus can be used to further compensate and fine-tune the tripping threshold in relation to temperature changes. In this manner, a temperature-compensated or adaptive overcurrent protection is achieved. When environmental temperature and the switch temperature changes, Liu Switch 300 can adapt to a new tripping value automatically. Thus, Liu Switch 300 provides an advanced protection function to protect human lives, the electrical network or the electric appliance in which Liu Switch 300 is installed, and Liu Switch 300 itself.

Of course, other thermal or temperature-sensitive elements can be used in Liu Switch 300 to achieve the same results discussed above.

FIG. 9c shows circuit 920, which is a variation of circuit 910 of FIG. 9a. In FIG. 9c, circuit 920 uses a center-tapped secondary coil TF2 in current detector 5, and provides full-wave rectification by diodes D6 and D7. In circuit 920, the threshold element is provided by reverse-biased Zener diode D5 and a load resistor R13.

FIG. 9d shows circuit 940, which is a variation of circuit 910 of FIG. 9a. In FIG. 9d, circuit 940 uses a diode bridge rectifier BZ2 to provide full-wave rectification of the voltage signal in Secondary coil TF2 of current detector 5. In circuit 940, the threshold element is provided by element TE1, which can be, for example, a PNPN four-layer Shockley diode and a load resistor R13.

Figure 10A:
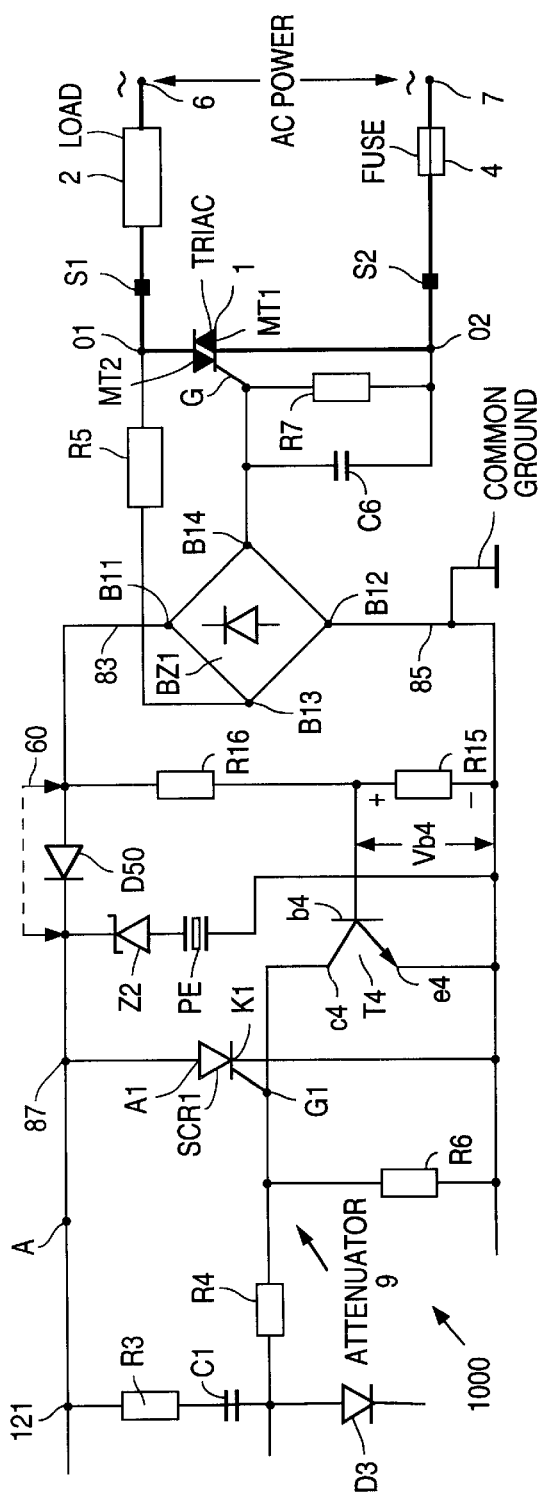
FIGS. 10a and 10b illustrate micro-current zero-crossing circuits 1000 and 1050 respectively, suitable for implementing zero-crossing detection circuit 10 of FIG. 1.
Figure 10B:
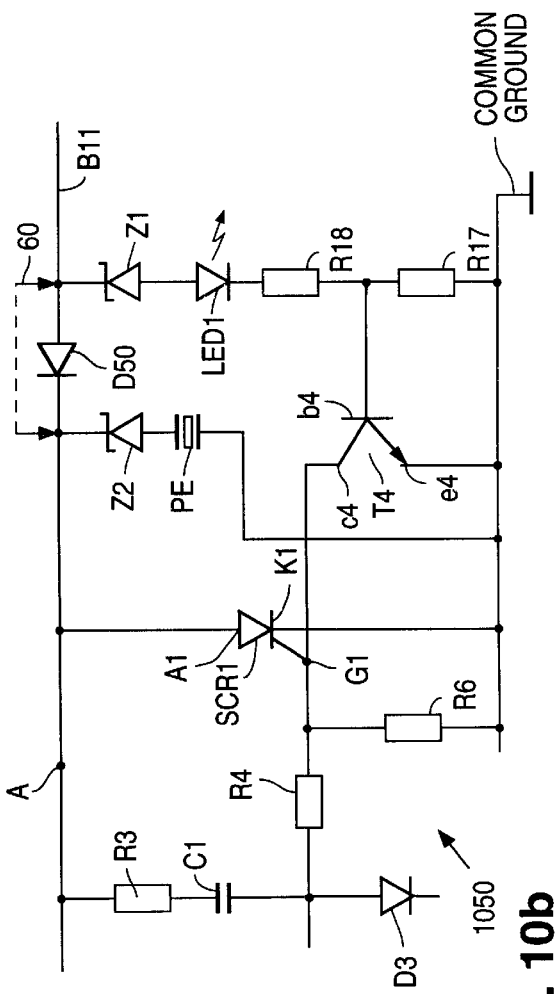
Figure 10C:
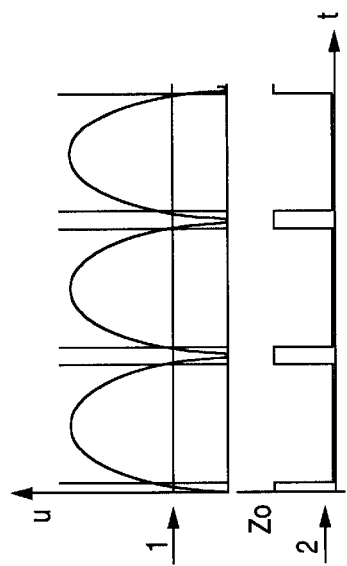
FIG. 10c shows waveforms 1 and 2, being respectively the threshold voltage $V_{thres}$, and the impedance at the gate terminal G1 of SCR1, due to the action of transistor T4.

FIGS. 10a and 10b illustrate optional zero-crossing circuits 1000 and 1050 respectively. As shown in FIG. 10a, circuit 1000 includes a voltage divider formed by resistors R16 and R15, which are connected in series between terminals 83 and 85 (i.e., also coupled to the common ground of Liu Switch 300) of SCR controlled bridge rectifier 8, and NPN transistor T4, which base terminal is controlled by output signal $V_{b4}$ of the voltage divider. During the "OFF" state of Liu Switch 300, NPN transistor T4, when conducting, provides a low impedance path to short the trigger signal at the gate terminal G1 of SCR1 to common ground. Voltage $V_{thres}$, which is the minimum voltage above which NPN transistor T4 conducts, is thus a threshold voltage above which G1 is not triggered. FIG. 10a also shows state memory and trigger circuit 12, attenuator 9, SCR controlled bridge rectifier 8 and main semiconductor switch 1 being implemented in the manner shown in 7a. Coupling diode D50 couples terminal 83 of SCR controlled bridge rectifier 8 to terminal 121 of trigger and control circuit 12. FIG. 10c shows waveforms 1 and 2, being respectively the threshold voltage $V_{thres}$ and the output impedance of transistor T4 at the gate terminal G1 of SCR1.

In circuit 1050 of FIG. 10b, the voltage divider of resistors R15 and R16 of circuit 1000 is replaced by series-connected Zener diode Z1, light-emitter diode (LED) LED1 (optional) and a voltage divider formed by resistors R18 and R17. Because of the relatively constant voltage drop across Zener diode Z1, when conducting, a more precise zero-crossing threshold voltage $V_{thres}$ can be selected from the voltage range of 9 volts to 19 volts. LED1 is included to allow Liu Switch 300 to be visible in the dark. This "night light" function, which requires less than 200 micro-amperes of current (still insufficient to trigger conduction in an implementation of main semiconductor switch 1 by a TRIAC or antiparallel SCRs), is particularly useful when Liu Switch 300 is used as a light switch.

FIGS. 10a and 10b also show a simple, small, inexpensive and, in the steady state, current leakage-free implementation of "beep" circuit 21 by series connected Zener diode Z2 and a piezoelectric speaker element PE between node A and common ground. When node A rises from substantially common ground (i.e., the "ON" state of Liu Switch 300) to a high DC voltage (i.e., the "OFF" state of Liu Switch 300), a breakdown current passes through Z2 and rapidly charges the capacitive piezoelectric element PE, thereby generating an audible sound. This audible response can also be provided by coupling the Zener diode Z2 and piezoelectric element PE across any two nodes which experience a sudden change voltage. An audible "beep" sound is generated by piezoelectric speaker element PE when Liu Switch 300 switches. Thus, beep circuit 21 can be used to provide an audible sound response to the operator when Liu Switch 300 switches.

Figure 11A:
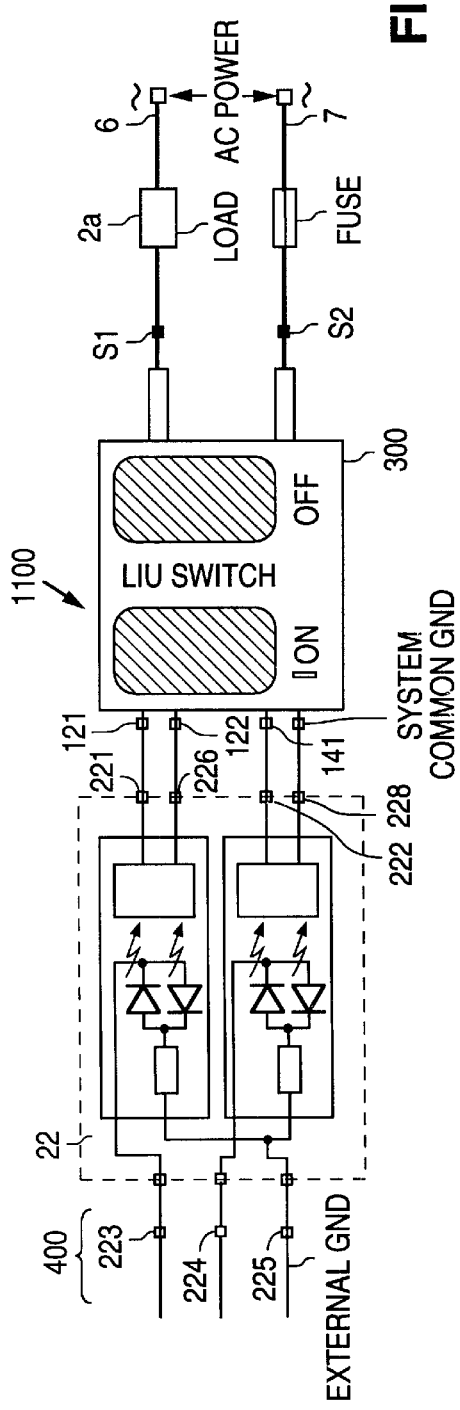
FIGS. 11a and 11b show implementations 1100 and 1150 of optocoupler circuits 22 and 23 of FIG. 1 coupled to Liu Switch 300, in the manner discussed above with respect to FIG. 1.
Figure 11B:
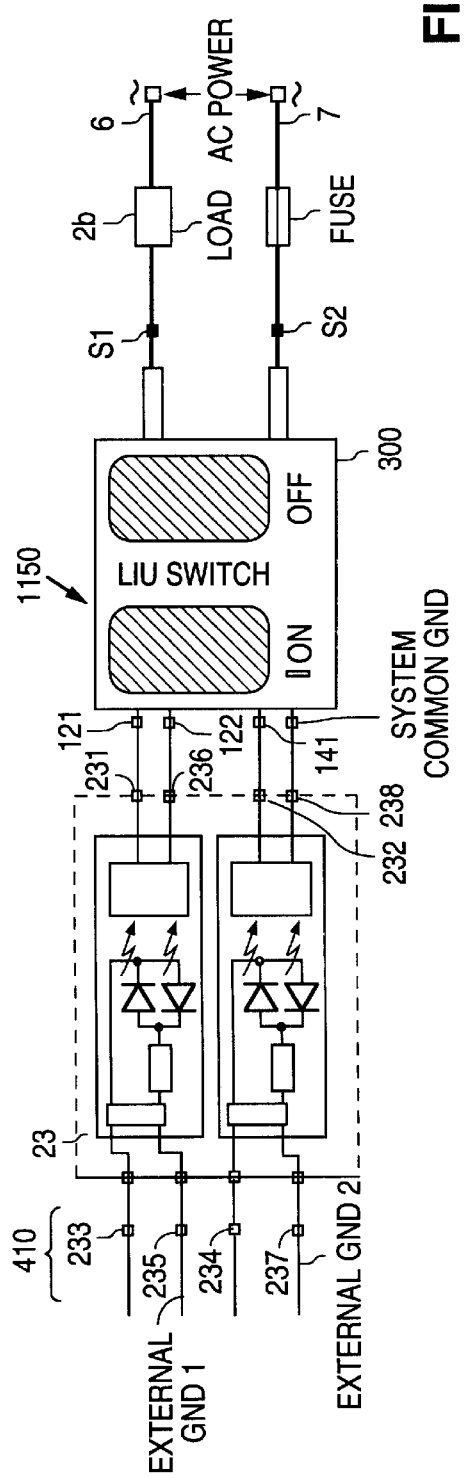
Figure 12A:
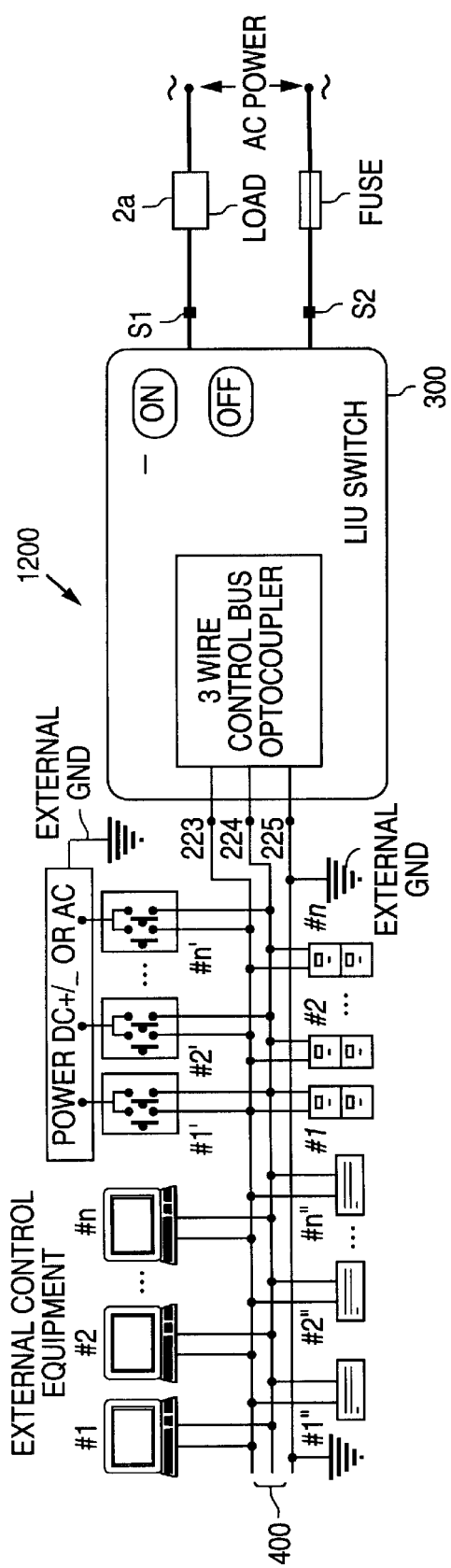
FIGS. 12a and 12b respectively show a 3-wire control bus 400 and a 4-wire control bus 410 which are used to provide multipoint random control of loads 2a and 2b by external equipment, through solid state switches 1200 and 1201, and to provide high isolation between the control bus, the Liu Switch and the power line.
Figure 12B:
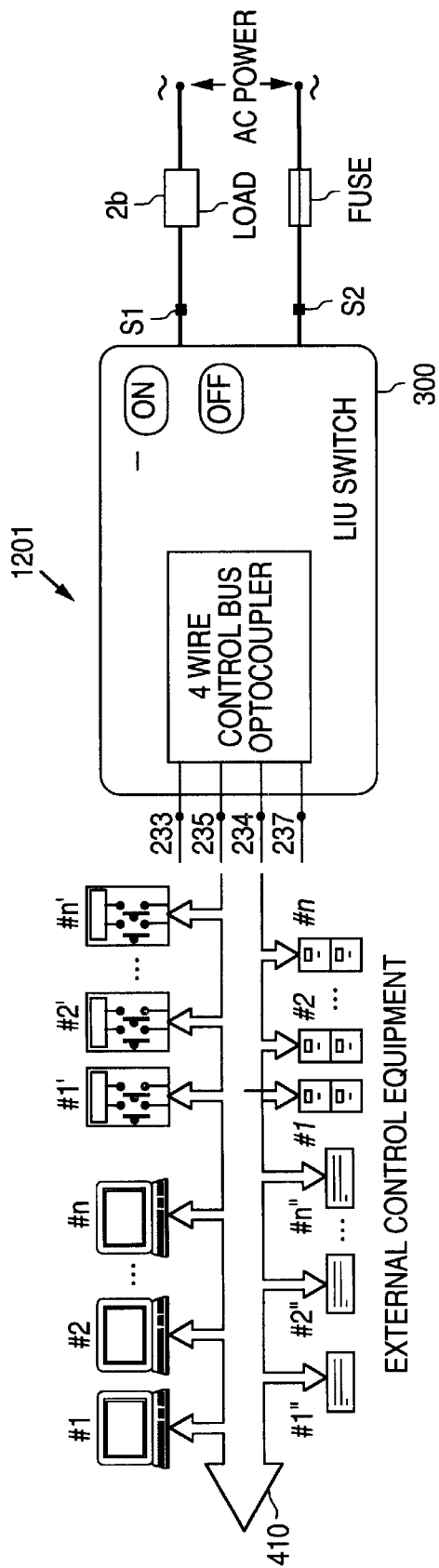

FIGS. 11a and 11b show implementations 1100 and 1150 of optocoupler circuits 22 and 23 coupled to Liu Switch 300 used as a multi-point random remote control solid state switch/relay, in the manner discussed above with respect to FIG. 1. Using optical isolation, input control signals at terminals 223 and 224 (relative to common external ground terminal 225) of circuit 1100 are isolated from output signals across terminals 221 and 226 ("ON"-channel), and across terminals 222 and 228 ("OFF"-channel), by up to thousands of volts. Similarly, input control signals at terminals 233 and 234 of circuit 1150 (relative to two individual, highly isolated external ground terminals 235 and 237, respectively) are isolated from output signals across terminals 231 and 236 ("ON"-channel), and across terminals 232 and 238("OFF"-channel), by up to thousands of volts. Thus, signals at terminal 223 and 224 and at external common ground terminal 225 can be provided from a 3-wire bus 400 on which any number of devices each capable of providing the control signals can be connected. FIG. 12a shows 3-wire control bus 400 used to provide multipoint random remote control by external equipment to load 2a through solid state switch 1200. Similarly, control signals at terminals 233, 234 and at external ground terminals 235 and 237 can be provided from a 4-wire bus 410 on which any number of devices each capable of providing the control signals can be connected. FIGS. 12b shows 4-wire control bus 410 used to provide multipoint random remote control to the load 2b through solid state switch 1201.

Figure 13:
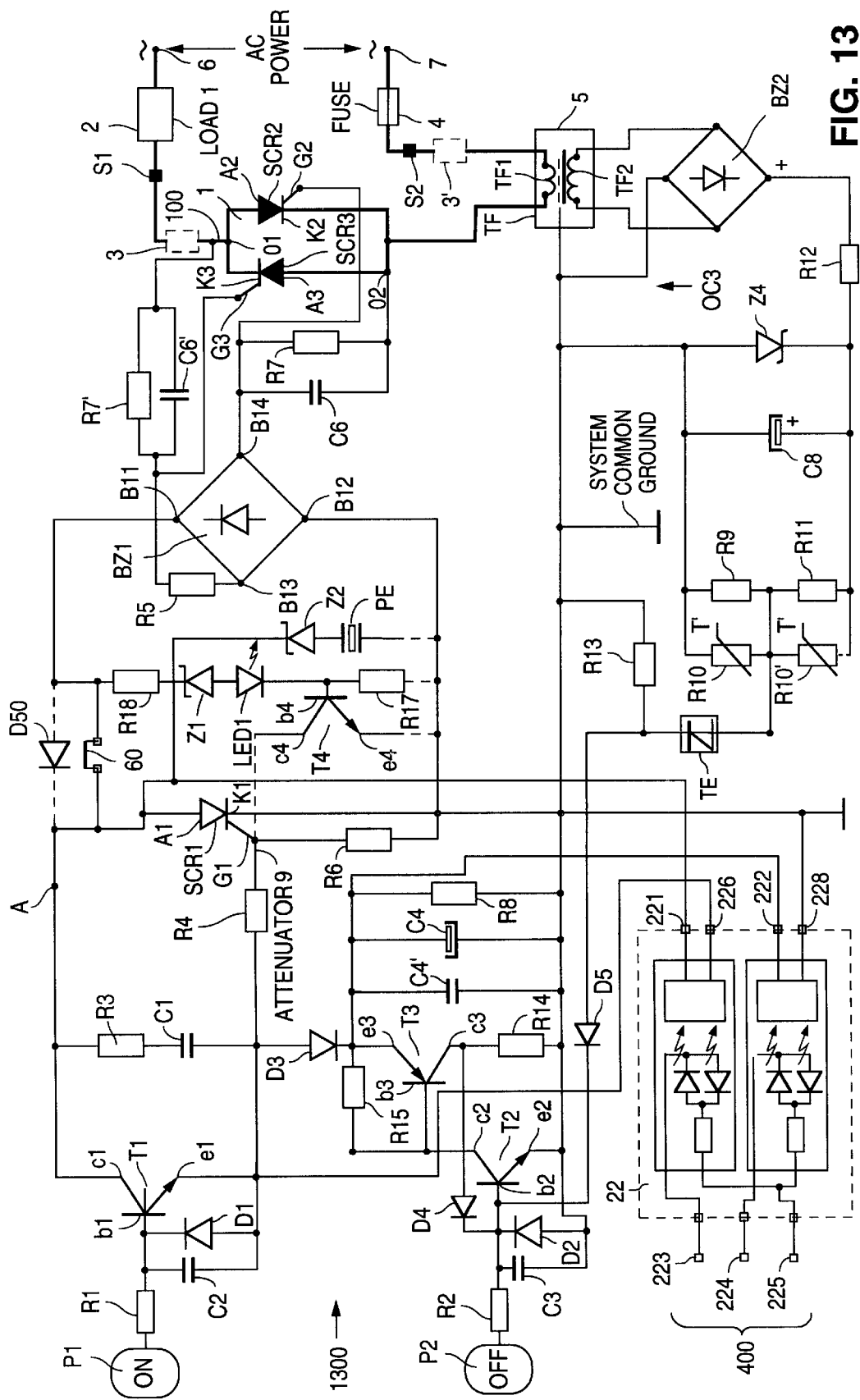
FIG. 13 shows a schematic diagram 1300 of one embodiment of the present invention.

FIG. 13 shows an embodiment of the present invention in circuit 1300, which combines various implementations of the various functional circuits of FIG. 1.

Liu Switch 300 has a built-in over-voltage protection and thus does not require protection by a protective device. This built-in over-voltage protection can be illustrated, for example, by reference to FIG. 7a. During the "OFF" state, if an over-voltage condition occurs (e.g., during a large voltage surge in the AC signal), such that the rectified twin half-wave DC signal across the collector and emitter terminals of transistor T1 exceeds the breakdown voltage of transistor T1, transistor T1 conducts. Conducting transistor T1 discharges capacitor C1. The current of conducting transistor T1 provides a triggering pulse, which triggers SCR1 through attenuator 9. Conducting SCR1 shorts diode bridge BZ1, which in turn triggers TRIAC 601 into a conducting state. Liu Switch 300 is thus switched into the "ON" state, so that the voltage across Liu Switch 300 drops to the voltage across conducting TRIAC 601. From this point, the regenerating feedback process described above sustains Liu Switch 300 in the "ON" state until Liu Switch 300 is switched into the "OFF" state by, for example, an external agent contacting touch panel 19. As the breakdown of transistor T1 and the conduction of TRIAC 601 occur within microseconds, because conduction of TRIAC 601 shorts the two terminals of semiconductor switch 1, thus substantially eliminating the voltage drop across Liu Switch 300, and also because the breakdown current of transistor T1 is limited by the resistance in attenuator 9, the over-voltage appearing across the terminals of Liu Switch 300 is too brief to cause damage to Liu Switch 300. Thus, Liu Switch 300 does not require protection by a protective device, even if the over-voltage condition persists in the AC signal. By eliminating the need for a protective device and by avoiding the cost of replacing damaged protective devices, Liu Switch 300 achieves substantial cost savings over the solid state switches of the prior art.

Thus, the present invention provides a switch which draws substantially no current during the "OFF" steady state, and requiring no power supply to operate the switch itself. In addition, the present invention provides a solid state switch that does not require a protective device for its over-voltage protection.

Numerous variations and modification within the scope of he present invention are possible. For example, gain circuits of Liu Switch 300 (e.g., gain circuits 11 and 14) may be implemented by another gain device, such as certain J-FETs, or MOS-FETs, Darlington bipolars, or another integrated circuit or operational amplifier. Main semiconductor switch device 1 can also be implemented by, for example, some IGBTs, GTOs, MCTs, V-MOSs, D-MOSs, power bipolars, or another bilateral triode thyristors.

The above detailed descriptions provided to illustrate the specific embodiments of the present invention described above, and is not intended to be limiting of the present invention. The present invention is set forth in the following claims.

I claim:

1. A solid state electrical switch for controlling a electrical load, comprising:
   a first terminal:
   a second terminal;
   a semiconductor switch coupled by said first terminal and said second terminal to form with said electrical load a series circuit across said AC power source, said semiconductor switch becoming conducting in response to receiving a control signal at a control terminal, said solid state electrical switch being in an "on" state when said semiconductor switch is conducting and in an "off" state when said semiconductor switch is not conducting; and
   a control circuit providing said control signal, said control circuit being coupled to said first and second terminals in a parallel configuration with said semiconductor switch wherein current in said control circuit has no current path in said "off" wherein said control circuit, which receives an electrical signal, comprises:
      a rectifier receiving, during said "off" state, an AC signal from said AC power source and rectifying said AC signal to provide a rectified signal; and
      a capacitor which is (a) coupled to receive said rectified signal during said "off" state; and (b) discharged in response to said electrical signal to generate said control signal, thereby rendering said semiconductor switch conducting.

2. A solid state electrical switch as in claim 1, wherein substantially no current flows in said control circuit during said "off" state.

3. A solid state electrical switch as in claim 1, wherein said control circuit is powered via said first and second terminals.

4. A solid state electrical switch as in claim 1, wherein, said control circuit includes a dynamic feedback circuit, said dynamic feedback circuit through said control signal triggering said semiconductor switch during said "on" state into conducting at the beginning of each half-cycle of an AC signal of said AC power source.

5. A solid state electrical switch as in claim 1, wherein said control circuit includes only solid state static components.

6. A solid state electrical switch as in claim 1, further comprising an overcurrent protection circuit which causes said semiconductor switch to become non-conducting when a current in said load device exceeds a predetermined value.

7. A solid state electrical switch as in claim 6, wherein said overcurrent protection circuit comprises temperature-sensitive components, such that said predetermined value of said overcurrent protection circuit varies with temperature of the ambient.

8. A solid state electrical switch as in claim 7, wherein said predetermined value of said overcurrent protection circuit varies with temperature of said solid state electrical switch.

9. A solid state electrical switch as in claim 6, wherein said overcurrent protection circuit comprises:
 a rectifier receiving said signal indicative of the current in said load device to provide a signal indicative of said current in said load device; and
 a threshold component coupled to receive said signal indicative of the magnitude of said current in said load device, said threshold component becoming conducting when said magnitude exceeds a predetermined value.

10. A solid state electrical switch as in claim 9, wherein said threshold component comprises a forward-biased silicon diode.

11. A solid state electrical switch as in claim 9, wherein said threshold component comprises a Zener diode.

12. A solid state electrical switch as in claim 9, wherein said threshold component comprises a 4-layer Shockley diode.

13. A solid state electrical switch as in claim 9, wherein said rectifier comprises a Zener diode.

14. A solid state electrical switch as in claim 9, wherein said rectifier comprises a diode bridge.

15. A solid state electrical switch as in claim 9, further comprising a resistor network between said rectifier and said threshold component, said resistor network including a thermistor.

16. A solid state electrical switch as in claim 6, wherein said overcurrent protection circuit comprises a current detector coupled to provide an electrical signal indicative of the current in said load device.

17. A solid state electrical switch as in claim 16, wherein said current detector comprises a transformer.

18. A solid state electrical switch as in claim 17, wherein said transformer provides a voltage output signal indicative of said current in said load device.

19. A solid state electrical switch as in claim 1, further comprising a touch panel electrically coupled to said control circuit, said touch panel providing said electrical signal received at said control circuit, when said touch panel is electrically coupled to an external agent.

20. A solid state electrical switch as in claim 19, wherein said electrical signal is provided by the impedance between said external agent and a ground reference.

21. A solid state electrical switch as in claim 20, wherein said impedance includes a resistive component.

22. A solid state electrical switch as in claim 20, wherein said impedance includes a capacitive component.

23. A solid state electrical switch as in claim 19, wherein said electrical signal includes a component provided by electromagnetic radiation collected by said external agent.

24. A solid state electrical switch as in claim 19, wherein said electrical signal is provided by a complementary effect resulting from two or more of: a component provided by electromagnetic radiation collected by said external agent, a resistive component in an impedance of said agent to ground, a capacitive component of said impedance, and an inductive component of said impedance.

25. A solid state electrical switch as in claim 19, wherein said touch panel is coupled to said control circuit-through a capacitor.

26. A solid state electrical switch as in claim 19, further comprising a low pass filter coupled to an input terminal of said control circuit.

27. A solid state electrical switch as in claim 19, wherein said touch panel comprises a metallic surface.

28. A solid state electrical switch as in claim 27, wherein said metallic surface is coated with a resistive material or an insulator.

29. A solid state electrical switch as in claim 27, wherein said metallic surface is coated with a dielectric material.

30. A solid state electrical switch as in claim 19, wherein said touch panel is coupled to said control circuit through a current limiting resistor.

31. A solid state electrical switch as in claim 19, further comprising an audio response circuit for providing an audible sound to said external agent upon contact with said touch panel.

32. A solid state electrical switch as in claim 31, wherein said audio response circuit comprises a Zener diode and a piezoelectric speaker element connected in series across an output terminal of said rectifier and a common ground.

33. A solid state electrical switch as in claim 19, wherein said touch panel is mounted in a plane offset from a mounting plate.

34. A solid state electrical switch as in claim 19, wherein said touch panel is of a first color, and wherein-said touch panel is mounted on a mounting plate of a second color different from said first color.

35. A solid state electrical switch as in claim 19, wherein said touch panel is coupled to said control circuit through a resistor serially connected with a capacitor.

36. A solid state electrical switch as in claim 19, wherein said touch panel comprises a resistive surface.

37. A solid state electrical switch as in claim 19, wherein said touch panel comprises a resistive surface and a dielectric material coated on said resistive surface, thereby providing said touch panel a capacitance.

38. A solid state electrical switch as in claim 19, wherein said electrical signal being provided as a result of said external agent touching said touch panel with a gloved hand.

39. A solid state electrical switch as in claim 1, said control circuit further comprising a gain circuit-responsive to said electrical signal, said gain circuit coupling said rectified signal to said control terminal in response to said electrical signal.

40. A solid state electrical switch as in claim 39, wherein said gain circuit comprises a bipolar transistor.

41. A solid state electrical switch as in claim 40, wherein said bipolar transistor comprises an NPN bipolar transistor and said gain circuit further comprises a diode coupled in an antiparallel manner between a base terminal of said bipolar transistor and an emitter terminal of said bipolar transistor, a collector terminal of said bipolar transistor being coupled to receive said rectified signal.

42. A solid state electrical switch as in claim 40, wherein said bipolar transistor comprises a PNP transistor, and said gain circuit further comprises a diode coupled in an antiparallel manner between a base terminal of said bipolar transistor and an emitter terminal of said bipolar transistor, said emitter terminal being coupled to receive said rectified signal.

43. A solid state electrical switch as in claim 39, wherein said gain circuit has a breakdown voltage, such that when said rectified signal attaining a voltage exceeding said breakdown voltage, said gain circuit becomes conducting, thereby coupling said rectified signal to said control terminal.

44. A solid state electrical switch as in claim 39, said control circuit further comprising a second gain circuit responsive to a second electrical signal, said second gain circuit providing a bypass signal path between said control terminal and a common ground of said control circuit, thereby preventing said control signal from reaching said semiconductor switch.

45. A solid state electrical switch as in claim 44, wherein said second gain circuit comprises a bipolar transistor.

46. A solid state electrical switch as in claim 45, wherein said second gain circuit further comprises a diode coupled in an antiparallel manner between a base terminal of said bipolar transistor and an emitter terminal of said bipolar transistor.

47. A solid state electrical switch as in claim 44, further comprising an overcurrent protection circuit providing said second electrical signal when a current in said semiconductor switch exceeds a predetermined value.

48. A solid state electrical switch as in claim 44, further comprising an initialization circuit including a second capacitor coupled between said control terminal and said common ground, said second capacitor having a capacitance larger than the capacitance of said capacitor of said control circuit.

49. A solid state electrical switch as in claim 48, wherein said second capacitor is coupled to said control terminal by a diode.

50. A solid state electrical switch as in claim 48, wherein said initialization circuit further comprising a resistor coupled to discharge said second capacitor to said common ground.

51. A solid state electrical switch as in claim 48, wherein said initialization circuit further comprises a resistor coupled in parallel with said second capacitor, wherein the time constant corresponding to the product of the resistance of said resistor and the capacitance of said second capacitor exceeds the charging time constant of said capacitor of said control circuit.

52. A solid state electrical switch as in claim 48, wherein said initialization circuit operates to ensure said semiconductor switch is non-conducting upon power up.

53. A solid state electrical switch as in claim 48, wherein said initialization circuit operates such that, when a power interruption occurs while said semiconductor switch is conducting, said semiconductor switch becomes conducting if power returns within a predetermined time interval, and becomes non-conducting when power returns after said predetermined time interval.

54. A solid state electrical switch as in claim 48, wherein said second capacitor comprises an electrolytic capacitor and an unpolarized capacitor coupled in parallel.

55. A solid state electrical switch as in claim 44, wherein said second gain circuit comprises a complementary cascade amplifier.

56. A solid state electrical switch as in claim 44, further comprising a second touch panel electrically coupled to said control circuit, such that upon said touch panel contacting with an external agent, said touch panel provides said second electrical signal.

57. A solid state electrical switch as in claim 56, wherein said first and second touch panels are distinguishable by tactile feel or color.

58. A solid state electrical switch as in claim 56, further comprising an audio response circuit for generating distinguishable audible sounds to indicate which of said first and second touch panels is contacted by an external agent.

59. A solid state electrical switch as in claim 56, wherein when said first and second panels are each contacted by an external agent substantially simultaneously, said semiconductor switch remains non-conducting.

60. A solid state electrical switch as in claim 1 further comprising a semiconductor element connected in parallel with said capacitor, said device having a conduction threshold voltage such that when said rectified signal attains a voltage exceeding said conduction threshold voltage, said semiconductor element becomes conducting, thereby discharging said capacitor and generating said control signal.

61. A solid state electrical switch as in claim 60, wherein said conduction threshold voltage is provided by a breakdown voltage of a transistor.

62. A solid state electrical switch as in claim 61, wherein said transistor comprises a bipolar transistor.

63. A solid state electrical switch as in claim 1, wherein said semiconductor switch becomes non-conducting when said AC signal crosses zero, whereupon said rectifier signal charges said capacitor resulting in a charging current providing said control signal.

64. A solid state electrical switch as in claim 1, further comprising a zero-crossing circuit coupled to receive said rectified signal and coupled to said control terminal, said zero-crossing circuit preventing said control signal from reaching said semiconductor switch except when said AC signal crosses zero.

65. A solid state electrical switch as in claim 64, wherein said zero-crossing circuit comprising a transistor coupling said control terminal to common ground, when said instantaneous level of said rectified signal is above said predetermined value.

66. A solid state electrical switch as in claim 65, wherein said transistor is controlled by the output signal of a voltage divider between an output terminal of said rectifier and a common ground.

67. A solid state electrical switch as in claim 66, said zero-crossing circuit further comprising a light-emitting diode and a Zener diode connected in series with said voltage divider.

68. A solid state electrical switch as in claim 1, wherein said rectifier comprises a diode bridge and said semiconductor switch comprises a silicon controlled rectifier (SCR).

69. A solid state electrical switch as in claim 1, wherein said semiconductor switch comprises a triode AC switch (TRIAC) coupled to receive said control signal.

70. A solid state electrical switch as in claim 1, wherein said semiconductor switch comprises antiparallel silicon controlled rectifiers (SCRs) triggered by said control signal.

71. A solid state electrical switch as in claim 1, wherein said rectifier comprises a SCR controlled bridge rectifier.

72. A solid state electrical switch as in claim 1, wherein said control circuit further comprises a resistor coupled in series with said capacitor between an output terminal of said rectifier and said control terminal.

73. A solid state electrical switch as in claim 1, wherein said control circuit further comprises an attenuator circuit coupled between said capacitor and said control terminal.

74. A solid state electrical switch as in claim 73, wherein said attenuator circuit comprises a voltage divider circuit.

75. A solid state electrical switch as in claim 1, wherein said semiconductor switch initializes to said "off" mode.

76. A solid state electrical switch as in claim 1, further comprising an optocoupler coupled to said control circuit and receiving an input signal, said optocoupler circuit providing said control circuit an optically isolated output signal corresponding to said input signal, whereupon receiving said optically isolated output signal, said control circuit providing said control signal, thereby rendering said semiconductor switch conductive.

77. A solid state electrical switch as in claim 1, wherein said solid state electrical switch is provided as a component of a multipoint random control system, said multipoint random control system comprising:
   an optocoupler coupled to said solid state electrical switch and to a signal bus, said optocoupler receiving an electrical signal from said signal bus to provide an optically isolated output signal as said control signal at said semiconductor switch; and
   a plurality of devices coupled to the signal bus, each device being capable of providing as output signals of said devices said control signals.

78. A solid state electrical switch as in claim 77, wherein said signal bus include a common ground signal relative to said electrical signal.

79. A solid state electrical switch as in claim 77, wherein said signal bus provides separate common ground signals relative to said electrical signal.

80. A solid state electrical switch as in claim 1, further comprising an initialization circuit having a first charging time constant and a first discharging time constant, wherein said first charging time constant being less than said first discharging time constant, wherein when said solid state electrical switch is in said "on" state, a first capacitor is charged according to said first charging time constant, and such that, when said "on" state is interrupted by loss of power in said AC power source, said first capacitor discharges at said first discharging time constant, thereby temporarily preserving a memory of said "on" state.

81. A solid state electrical switch as in claim 80, wherein said initialization circuit further includes a second discharging time constant less than said first discharging time constant, said second discharging time constant providing a discharge of said first capacitor to reset initialization circuit from said "on" state to said "off" state.

82. A solid state electrical switch as in claim 80, wherein said initialization circuit further comprises:
   a diode coupled to a first terminal of said first capacitor, a second terminal of said first capacitor being coupled to a ground terminal; and
   a resistor coupled between said cathode of said diode and said ground terminal.

83. A solid state electrical switch as in claim 80, wherein said first capacitor comprises an electrolytic capacitor and a non-polarized capacitor coupled in parallel.

84. A solid state electrical switch as in claim 1, further comprising a light-emitting material provided to render said solid state electrical switch visible in the dark.

85. A solid state electrical switch as in claim 84, wherein said light-emitting material comprises a phosphate.

86. A solid state electrical switch as in claim 84, wherein said light-emitting material comprises sulfur.

* * * * *